US007095352B2

(12) United States Patent
Tani et al.

(10) Patent No.: US 7,095,352 B2
(45) Date of Patent: Aug. 22, 2006

(54) ANALOG-TO-DIGITAL CONVERTER INCLUDING A PLURALITY OF AMPLIFIER CIRCUITS

(75) Inventors: Kuniyuki Tani, Ogaki (JP); Atsushi Wada, Ogaki (JP); Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/066,498

(22) Filed: Feb. 28, 2005

(65) Prior Publication Data
US 2005/0200512 A1    Sep. 15, 2005

(30) Foreign Application Priority Data
Mar. 2, 2004 (JP) ............................. 2004-058273
Mar. 2, 2004 (JP) ............................. 2004-058274

(51) Int. Cl.
*H03M 1/12* (2006.01)
(52) U.S. Cl. ..................... 341/155; 341/156; 341/161; 341/162; 341/163
(58) Field of Classification Search ............... 341/156, 341/161–162
See application file for complete search history.

(56) References Cited

U.S. PATENT DOCUMENTS 5,159,342 A * 10/1992 Yotsuyanagi ............... 341/161
5,966,088 A * 10/1999 Matsumoto et al. ........ 341/156
6,195,032 B1 * 2/2001 Watson et al. ............. 341/162
6,710,735 B1 * 3/2004 Lin .......................... 341/161
6,859,158 B1 * 2/2005 Wada et al. ................ 341/155
6,882,297 B1 * 4/2005 Wada et al. ................ 341/161

FOREIGN PATENT DOCUMENTS

JP          4-26229         1/1992

* cited by examiner

*Primary Examiner*—Rexford Barnie
*Assistant Examiner*—Khai Nguyen
(74) *Attorney, Agent, or Firm*—McDermott Will & Emery LLP

(57) ABSTRACT

An AD converter includes therein a plurality of amplifier circuits such as first to fourth amplifier circuits. Among the plurality of amplifier circuits an amplifier circuit that requires higher accuracy is placed nearer to a power source. An amplifier circuit that receives the first input of an input analog signal is placed nearest to the power source. That is, the first amplifier circuit in the embodiment is disposed closest to the power source. The amplifier circuit that receives the first input of an input analog signal is disposed closest to the power source compared to the other amplifier circuits. The first amplifier circuit, the second amplifier circuit, the third amplifier circuit and the fourth amplifier circuit in the embodiment are placed in this order of how close to the power source.

30 Claims, 16 Drawing Sheets

ANALOG-TO-DIGITAL CONVERTER INCLUDING A PLURALITY OF AMPLIFIER CIRCUITS

BACKGROUND OF THE INVENTION

1. Field of the Invention

The present invention generally relates to an analog-to-digital converters and it particularly relates to an analog-to-digital converter of a pipeline type and that of a cyclic type in which analog signals are converted to digital signals in such a manner that an analog signal is circulated cyclically or a plurality of times in the same function block.

2. Description of the Related Art

In recent years, the mobile devices such as mobile phones are provided with an increasing variety of added functions including image shooting function, image playback function, moving image shooing function and moving image playback. Along with this trend, there is a growing demand for miniaturization, high accuracy, high speed and power saving of an analog-to-digital converter (hereinafter, referred to as an AD converter). One mode of AD converter that addresses this demand is known as a cyclic AD converter which cycles through stages (see, for example, Reference (1) in the following Related Art List).

RELATED ART LIST (1) Japanese Patent Application Laid-Open No. 04-26229.

In FIG. 1 of the above-mentioned Reference (1), the preceding stage is provided with a sample-and-hold circuit S/H1 and a subtracter circuit SUB1 having an amplifying function, and the subsequent stage is provided with a sample-and-hold circuit S/H3, a sample-and-hold circuit S/H4 and a subtracter circuit SUB2 having an amplifying function. These circuits are assumed to be structured using operational amplifiers. And drive power must be supplied to these operational amplifiers. When an AD converter using a plurality of operational amplifiers is to be structured as an integrated circuit like this, power supply lines from the power source to the respective operational amplifiers must be provided to supply power. Since such power supply wiring involves resistance components, circumstances must be assumed where the power supply voltage may drop and as a result not enough supply voltage is supplied to the operational amplifiers. Also, there may be cases where some noise components ride on the substrate of the integrated circuit. In such a case the noise source may adversely affect the operational amplifiers, thus deteriorating their characteristics. If the characteristics of the operational amplifiers deteriorate due to any causes including the above, the accuracy of the AD converter as a whole will deteriorate.

SUMMARY OF THE INVENTION

The present invention has been made in view of the aforementioned circumstances and its objective is to improve the accuracy of an AD converter as a whole.

A preferred embodiment according to the present invention relates to an analog-to-digital circuit. This analog-to-digital circuit, which converts an analog signal to a digital signal of a plurality of bits in such a manner that an analog signal is circulated a plurality of times, has a plurality of amplifier circuits, wherein an amplifier circuit that requires higher precision among the plurality of amplifier circuits is placed in a position closer to a power source.

It is to be noted that any arbitrary combination of the above-described structural components and expressions mutually replaced by among a method, an apparatus, a system and so forth are all effective as and encompassed by the present embodiments.

DETAILED DESCRIPTION OF THE INVENTION

Figure 1:
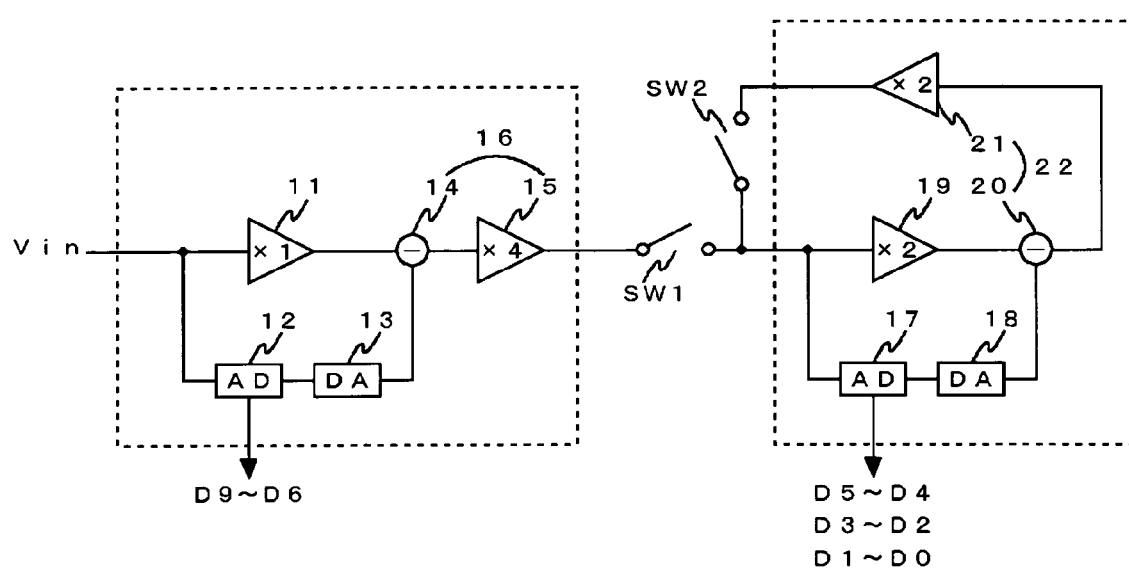
FIG. 1 illustrates a structure of an AD converter according to a first embodiment of the present invention.

Some embodiments which typically represent the present invention will be first described.

A preferred embodiment according to the present invention relates to an analog-to-digital converter. This analog-to-digital converter converts an analog signal to a digital signal of a plurality of bits in such a manner that an analog signal is circulated a plurality of times, and the analog-to-digital circuit is characterized in that it has a plurality of amplifier circuits wherein an amplifier circuit that requires higher accuracy among the plurality of amplifier circuits is placed nearer to a power source.

In an analog-to-digital converter, of a pipeline, cyclic or mixed type, which converts an analog signal to a digital signal of a plurality of bits in such a manner that an input analog signal is circulated a plurality of times, the equal level of accuracy or precision is not necessarily required by among a plurality of amplifier circuits. The higher precision is required of an amplifier that performs amplification on a part closer to the higher-order bits whereas the precision required thereof is looser as the part is getting closer to the lower-order bits. According to the present embodiment, an amplifier that requires higher accuracy among the plurality of amplifier circuits is placed nearer to a power source. As a result, the total length of power supply wiring is shortened and the high-precision power supply voltage with small voltage drop can be supplied. Thus, the precision of said amplifier circuit becomes high and the precision of an AD converter as a whole is improved. The "amplifier circuits" may include one with 1X gain, namely, a sample-and-hold circuit. When an AD converter is structured as an integrated circuit, a power supply input terminal is included in the "power source".

It is preferable that an amplifier circuit to which the input analog signal is first inputted be placed nearer to the power source than the other amplifier circuits. By employing this structure, the precision of an amplifier circuit that handles the largest signal can be improved. Moreover, it is preferable that a plurality of amplifier circuits be placed nearer to the power supply in accordance with the order in which the input analog signal is transmitted. As a transition is made from the conversion of higher-order bits to that of lower-order bits, the degree of precision required by the respective components will decrease. And the degree of precision required of amplifier circuits can be set accordingly.

Among a plurality of amplifier circuits, an amplifier circuit that requires accuracy is preferably placed in a position away from a circuit of a noise source. In particular, if the mixture of an analog circuit and a digital circuit is structured as an integrated circuit, the analog circuit is susceptible to noise and is likely to be adversely affected if the noise occurs. With this structure where an amplifier requiring higher precision is placed farther away from the noise source, the distance from the noise source is gained and, hence, the noise can be reduced by the effect of a low-pass filter utilizing the resistance component of a substrate or capacitance components. Thus, the degree of precision of said amplifier circuit is raised and the precision of an AD-converter as a whole is improved.

It is preferable that an amplifier circuit to which the input analog signal is first inputted be placed in a position farther away, from a circuit of a noise source, than the other amplifier circuits. By employing this structure, the precision of an amplifier circuit that handles the largest signal can be improved. Moreover, it is preferable that a plurality of amplifier circuits be respectively placed in positions farther away, from a circuit of a noise source, in accordance with the order in which an input analog signal is transmitted. As a transition is made from the conversion of higher-order bits to that of lower-order bits, the degree of precision required will decrease. And the degree of precision required of amplifier circuits can be set accordingly. Here, the circuit of a noise source may be a clock generation circuit that generates clock signals, a digital circuit that performs digital signal processings or the like. Heavy currents flow into a clock generation circuit, which in turn becomes a large noise source. Thus, an amplifier circuit placed in a position farther away from the clock generation circuit will have a better noise characteristic.

An analog-to-digital converter is preferably such that the converter includes a plurality of stages each of which converts an inputted analog signal to a digital value of a predetermined bit number, wherein one or more of the plurality of stages includes one amplifier circuit among the plurality of amplifier circuits, and wherein the one amplifier circuit amplifies a difference between the inputted analog signal and a signal after conversion of a digital value to be converted in own stage into an analog signal, and feeds the amplified difference back to an input of the own stage. In this manner, the amplifier circuits in a pipeline-type AD converter that includes a plurality of stages equipped with a cyclic stage of 1-step amplification are configured according to the structure described above, so that the precision of this AD converter circuit as a whole can be improved.

An analog-to-digital converter is preferably such that the converter includes a plurality of stages each of which converts an inputted analog signal to a digital value of a predetermined bit number, wherein one or more of the plurality of stages includes two amplifier circuits among the plurality of amplifier circuits, wherein a first amplifier circuit of the two amplifier circuits amplifies the inputted analog signal at a first predetermined gain, and wherein a second amplifier circuit of the two amplifier circuits amplifies, at a second predetermined gain, a difference between an analog signal outputted from the first amplifier circuit and a signal which is amplified by a gain practically identical to the first predetermined gain and is subjected to conversion of a digital value to be converted in own stage into an analog signal, and feeds the amplified difference back to an input of the own stage. In this manner, the amplifier circuits in a pipeline-type AD converter that includes a plurality of stages equipped with a cyclic stage of 2-step amplification are configured according to the structure described above, so that the precision of this AD converter circuit as a whole can be improved. It is to be noted here that the "first amplifier circuit" may contain 1X gain, namely, a sample-and-hold circuit.

An analog-to-digital converter is preferably such that the converter includes: an AD converter circuit which converts an inputted analog signal to a digital value of a predetermined bit number; and a DA converter circuit which converts an output of the AD converter circuit to an analog signal, wherein a first amplifier circuit of the plurality of amplifier circuits amplifies the inputted analog signal by a first predetermined gain, and wherein a second amplifier circuit of the plurality of amplifier circuits amplifies, by a second predetermined gain, a difference between an analog signal outputted from the first amplifier circuit and an analog signal, outputted from the DA converter circuit, which is amplified by a gain practically identical to the first predetermined amplification factor, and outputs the amplified difference to the AD converter circuit and the first amplifier circuit. In this manner, the amplifier circuits in a cyclic-type AD converter are configured according to the structure described above, so that the precision of this AD converter circuit as a whole can be improved. The "first amplifier circuit" may contain 1X gain, namely, a sample-and-hold circuit.

Another preferred embodiment according to the present invention relates also to an analog-to-digital converter. This analog-to-digital converter converts an analog signal to a digital signal of a plurality of bits in such a manner that an input analog signal is circulated a plurality of times, and the analog-to-digital converter is characterized in that it has a plurality of amplifier circuits wherein an amplifier circuit that requires higher accuracy among said plurality of amplifier circuits is placed in a position away from a circuit of a noise source.

In an analog-to-digital converter, of a pipeline, cyclic or mixed type, which converts an analog signal to a digital signal of a plurality of bits in such a manner that an input analog signal is circulated a plurality of times, the equal level of accuracy or precision is not necessarily required by among a plurality of amplifier circuits. The higher precision is required of an amplifier that performs amplification on a part closer to the higher-order bits whereas the precision required thereof is looser as the part is getting closer to the lower-order bits. According to the present embodiment, an amplifier that requires higher accuracy among the plurality of amplifier circuits is placed in a position away from a circuit of a noise source, so that the distance from the noise source is gained and the noise can be reduced by the effect of a low-pass filter utilizing the resistance component of a substrate or capacitance components. Thus, the degree of precision of said amplifier circuit is raised and the precision of an AD-converter as a whole is improved. The "amplifier circuits" may include one with 1X gain, namely, a sample-and-hold circuit.

It is preferable that an amplifier circuit to which the input analog signal is first inputted be placed in a position farther away, from a circuit of a noise source, than the other amplifier circuits. By employing this structure, the precision of an amplifier circuit that handles the largest signal can be improved. Moreover, it is preferable that a plurality of amplifier circuits be placed in a position away from the circuit of a noise source in accordance with the order in which the input analog signal is transmitted. As a transition is made from the conversion of higher-order bits to that of lower-order bits, the degree of precision required by the respective components will decrease. And the degree of precision required of amplifier circuits can be set accordingly. Here, the circuit of a noise source may be a clock generation circuit that generates clock signals, a digital circuit that performs digital signal processings or the like. In particular, if the mixture of an analog circuit and a digital circuit is structured as an integrated circuit, the analog circuit is susceptible to noise and is likely to be adversely affected if the noise occurs. Heavy currents flow into a clock generation circuit, which in turn becomes a large noise source. Thus, an amplifier circuit placed in a position farther away from the clock generation circuit will have a better noise characteristic.

An analog-to-digital converter is preferably such that the converter includes: a plurality of stages each of which converts an inputted analog signal to a digital value of a predetermined bit number, wherein one or more of the plurality of stages includes one amplifier circuit among the plurality of amplifier circuits, and wherein the one amplifier circuit amplifies a difference between the inputted analog signal and a signal after conversion of a digital value to be converted in own stage into an analog signal, and feeds the amplified difference back to an input of the own stage. In this manner, the amplifier circuits in a pipeline-type AD converter that includes a plurality of stages equipped with a cyclic stage of 1-step amplification are configured according to the structure described above, so that the precision of this AD converter circuit as a whole can be improved.

An analog-to-digital converter according is preferably such that the converter includes: a plurality of stages each of which converts an inputted analog signal to a digital value of a predetermined bit number, wherein one or more of the plurality of stages includes two amplifier circuits among the plurality of amplifier circuits, wherein a first amplifier circuit of the two amplifier circuits amplifies the inputted analog signal by a first predetermined gain, and wherein a second amplifier circuit of the two amplifier circuits amplifies, by a second predetermined gain, a difference between an analog signal outputted from the first amplifier circuit and a signal which is amplified by a gain practically identical to the first predetermined gain and is subjected to conversion of a digital value to be converted in own stage into an analog signal, and feeds the amplified difference back to an input of the own stage. In this manner, the amplifier circuits in a pipeline-type AD converter that includes a plurality of stages equipped with a cyclic stage of 2-step amplification are configured according to the structure described above, so that the precision of this AD converter circuit as a whole can be improved. It is to be noted here that the "first amplifier circuit" may contain 1X gain, namely, a sample-and-hold circuit.

An analog-to-digital converter is preferably such that the converter includes: an AD converter circuit which converts an inputted analog signal to a digital value of a predetermined bit number; and a DA converter circuit which converts an output of the AD converter circuit to an analog signal, wherein a first amplifier circuit of the plurality of amplifier circuits amplifies the inputted analog signal by a first predetermined gain, and wherein a second amplifier circuit of the plurality of amplifier circuits amplifies, by a second predetermined gain, a difference between an analog signal outputted from the first amplifier circuit and an analog signal, outputted from the DA converter circuit, which is amplified by a gain practically identical to the first predetermined gain, and outputs the amplified difference to the AD converter circuit and the first amplifier circuit. In this manner, the amplifier circuits in a cyclic-type AD converter are configured according to the structure described above, so that the precision of this AD converter circuit as a whole can be improved. The "first amplifier circuit" may contain 1X gain, namely, a sample-and-hold circuit.

First Embodiment

A first embodiment of the present invention relates to an AD converter capable of outputting a total of 10 bits by converting 4 bits in the preceding stage, which is a noncyclic-type AD converter and performing three cycles of 2-bit conversion in the subsequent stage, which is a cyclic-type AD converter.

FIG. 1 illustrates a structure of an AD converter according to the first embodiment. Firstly a description will be given of the preceding stage of the AD converter. An input analog signal Vin is inputted to a first amplifier circuit 11 and a first AD converter circuit 12. The first AD converter circuit 12 is a flash type whose resolution, or the number of bits to be converted, is 4 bits. The first AD converter circuits 12 converts the input analog signal into a digital value, retrieves 4 higher-order bits (D9 to D6) and outputs them to an encoder (not shown) and a first DA converter circuit 13. The first DA converter circuit 13 converts the digital value outputted from the first AD converter circuit 12 into an analog signal The first amplifier circuit 11 sample-and-holds the inputted analog signal and outputs it to a first subtracter circuit 14 with a predetermined timing. The first amplifier circuit 11 does not amplify the analog signal but functions as a sample-and-hold circuit. The first subtracter circuit 14 subtracts the output of the first DA converter circuit 13 from the output of the first amplifier circuit 11. A second amplifier circuit 15 amplifies the output of the first subtracter circuit 14 by a factor of 2. It is to be noted that the first subtracter circuit 14 and the second amplifier circuit 15 may be formed as an integrally structured first subtracter-amplifier circuit 16. This way, the circuit can be simplified.

A description will now be given of the subsequent stage. A first switch SW1 and a second switch SW2 turn on and off alternately with each other. When the first switch SW1 is on and the second switch SW2 is off, an analog signal inputted from the preceding stage via the first switch SW1 is inputted to a third amplifier circuit 19 and a second AD converter circuit 17. The second AD converter circuit 17 is also a flash type whose resolution, or the number of bits including one redundant bit, is 3 bits. A reference voltage supplied to a voltage comparison element constituting the second AD converter circuit 17 is set to ½ of a reference voltage supplied to a voltage comparison element constituting the first AD converter circuit 12. The second AD converter circuits 17, which performs a 2-bit conversion, must amplify the analog signal after the conversion at the first AD converter circuit 12 practically by a factor of 4 (2 squared). However, since the gain of the second amplifier circuit 15 is 2, adjustment is made by the use of the ½ reference voltage. The second AD converter circuits 17 converts the inputted analog signal into a digital value, retrieves 5th and 6th higher-order bits (D5 and D4) and outputs them to an encoder (not shown) and a second DA converter circuit 18. The second DA converter circuit 18 converts the digital value converted by the second AD converter circuit 17 into an analog signal.

A third amplifier circuit 19 amplifies the inputted analog signal by a factor of 2 and outputs the resulting signal to a second subtracter circuit 20. The second subtracter circuit 20 subtracts the output of the second DA converter circuit 18 from the output of the third amplifier circuit 19 and outputs the difference to a fourth amplifier circuit 21. Here the output of the second DA converter circuit 18 is practically a result of amplification by a factor of 2. This can be realized by setting the ratio of the reference voltage range of the second AD converter circuit 17 to that of the second DA converter circuit 18 at 1:2. For example, the ratio of 1:2 may be set if a single input is made to the second AD converter circuit 17 and a differential output is made from the second DA converter circuit 18.

A fourth amplifier circuit 21 amplifies the output of the second subtracter circuit 20 by a factor of 2. At this stage, the first switch SW1 is off and the second switch SW2 is on. Thus the analog signal amplified at the fourth amplifier circuit 21 is fed back to the third amplifier circuit 19 and the second AD converter circuit 17 via the second switch SW2. It is to be noted that the second subtracter circuit 20 and the fourth amplifier circuit 21 may be formed as an integrally structured second subtracter-amplifier circuit 22. From here on, the above-described processing is repeated, and the second AD converter circuit 17 retrieves the 7th and 8th higher-order bits (D3 and D2) and the 9th and 10th higher-order bits (D1 and D0). In this fashion, a digital value composed of ten bits is obtained. The 5th to 10th higher-order bits are obtained in the subsequent stage, which is a cyclic-type AD converter.

Figure 2:
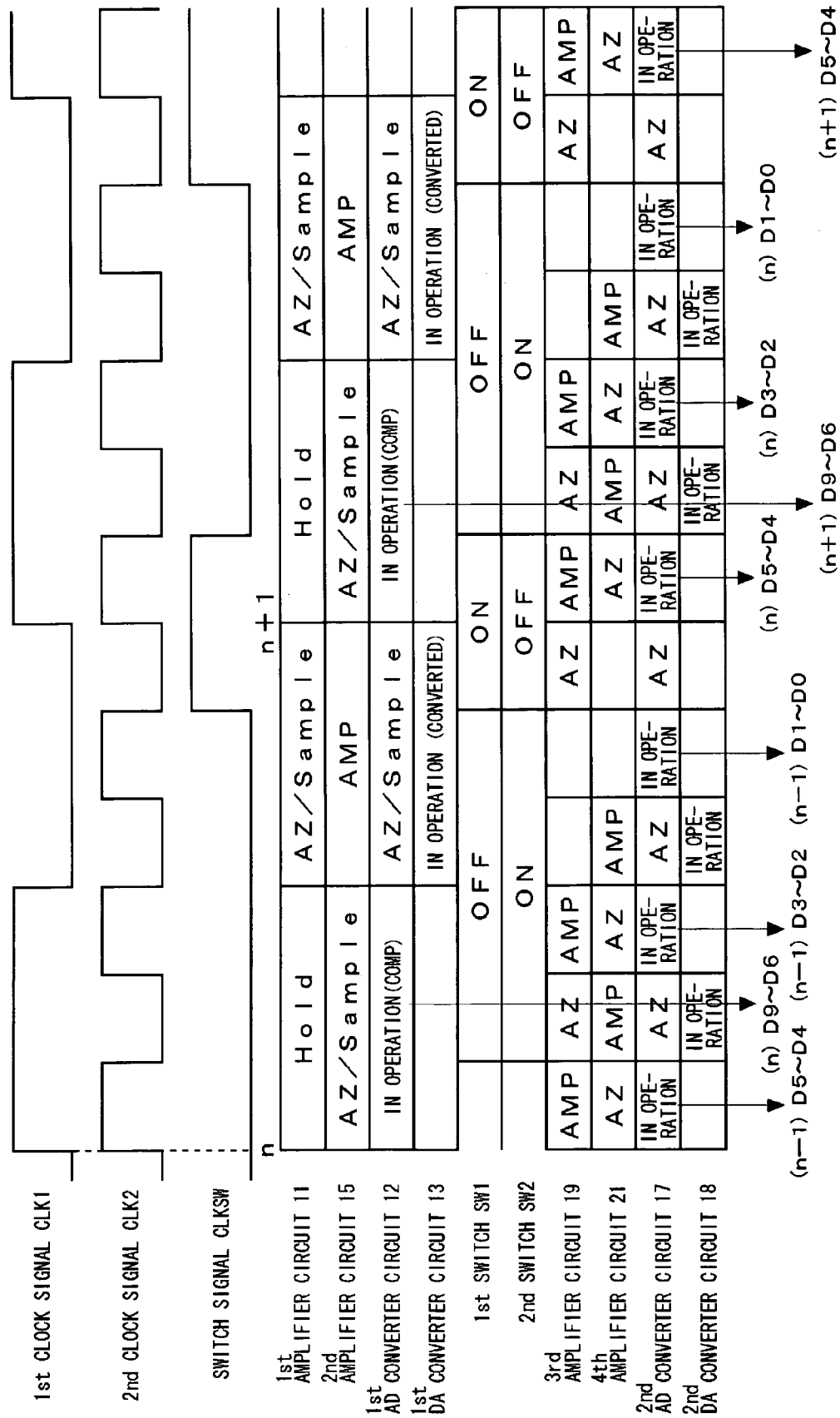
FIG. 2 is a timing chart illustrating an operating process of an AD converter according to a first embodiment of the present invention.

FIG. 2 is a timing chart illustrating an operating process of an AD converter according to the first embodiment. The process will be described starting from the top of FIG. 2 downward. Three waveforms from the top are a first clock signal CLK1, a second clock signal CLK2 and a switch signal CLKSW in the this order. The first clock signal CLK1 controls the operation of the first amplifier circuit 11, the second amplifier circuit 15, the first AD converter circuit 12 and the first DA converter circuit 13. The second clock signal CLK2 controls the operation of the third amplifier circuit 19, the fourth amplifier circuit 21, the second AD converter circuit 17 and the second DA converter circuit 18. The switch signal CLKSW effects on/off control of the first switch SW1 and the second switch SW2.

The frequency of the second clock signal CLK2 is three times that of the first clock signal CLK2. The second clock signal CLK2 may be generated by multiplying the first clock signal CLK1 using a PLL or the like. A rising edge of the second clock signal CLK2 is synchronized with a rising edge of the first clock signal CLK1. Subsequently, the second falling edge of the second clock signal CLK2 is synchronized with the next falling edge of the first clock signal CLK1. Furthermore, the fourth rising edge of the second clock signal CLK2 is synchronized with the second rising edge of the first clock signal CLK1. Since the frequency of the second clock CLK2 is three times that of the first clock signal CLK1, the conversion speed in the subsequent stage is three times that of the conversion speed in the preceding stage. The precision in analog processings such as subtraction and amplification for conversion into relatively higher bits largely affect overall precision in conversion. Therefore, the preceding stage responsible for conversion into relatively higher bits is required to provide high precision. Thus in the present embodiment, it is possible to increase the speed of operation in the subsequent stage as compared to the preceding stage since the subsequent stage is not required to provide precision as high as that required in the preceding stage.

The first amplifier circuit 11 and the first AD converter circuit 12 sample the input analog signal Vin at a rising edge of the first clock signal CLK1. The first amplifier circuit 11 holds the sampled analog signal when the first clock signal CLK1 is high and is placed in an autozero operation mode when the first clock signal CLK1 is low. The second amplifier circuit 15 samples the input analog signal at a falling edge of the first clock signal CLK1. When the first clock signal CLK1 is low, the second amplifier circuit 15 amplifies the sampled analog signal and outputs the amplified signal to the third amplifier circuit 19 and the second AD converter circuit 17. When the first clock signal CLK1 is high, the second amplifier circuit 15 is placed in an autozero operation mode. The first AD converter circuit 12 carries out a conversion operation and then outputs a digital value composed of D9 to D6 bits when the first clock signal CLK1 is high, and is placed in an autozero operation mode when the first clock signal CLK1 is low. The first DA converter circuit 13 holds the converted data when the first clock signal CLK1 is low, and is in an unstable state when the first clock signal CLK1 is high.

The first switch SW1 is turned on when the switch signal CLKSW is high and turned off when the switch signal CLKSW is low. The second switch SW2 is turned on when the switch signal CLKSW is low and turned off when the switch signal CLKSW is high.

The third amplifier circuit 19 and the second AD converter circuit 17 sample the input analog signal at a rising edge of the second clock signal CLK2. The third amplifier circuit 19 amplifies the sampled analog signal when the second clock signal CLK2 is high and is placed in an autozero operation mode when the second clock signal CLK2 is low. The third amplifier circuit 19 does not amplify while the second AD converter circuit 17 converts into the lowest bits D1 and D0. The fourth amplifier circuit 21 samples the input analog signal at a falling edge of the second clock signal CLK2. The fourth amplifier circuit 4021 amplifies the sampled analog signal when the second clock signal CLK2 is low and is placed in an autozero operation mode when the second clock signal CLK2 is low. Amplification is not performed during the subsequent half-clock period after the second AD converter circuit 4017 converted into the bits D1–D0.

When the second clock signal CLK2 is high, the second AD converter circuit 4017 converts into 2 bits, with redundant bits being eliminated. The second AD converter 17 is placed in an autozero operation mode when the second clock signal CLK2 is low. The second DA converter circuit 18 holds the converted data when the second clock signal CLK2 is low and is in an unstable state when the second clock signal CLK2 is high. Conversion is not performed when the second AD converter circuit 4017 outputs the bits DL-D0.

In an autozero period of the first amplifier circuit 11, the second amplifier circuit 15, the third amplifier circuit 19, the fourth amplifier circuit 21, the first AD converter circuit 12 and the second AD converter circuit 17, the input signal is being sampled. As shown in FIG. 2, concurrently with the conversion by the second AD converter circuit 17 into D5 and D4 and D3 and D2, the first AD converter circuit 12 converts from a subsequently input analog signal Vin. According to this pipeline processing as described above, the AD converter as a whole is capable of outputting a digital value of 10 bits once in a cycle defined by the first clock signal CLK1.

Figure 3:
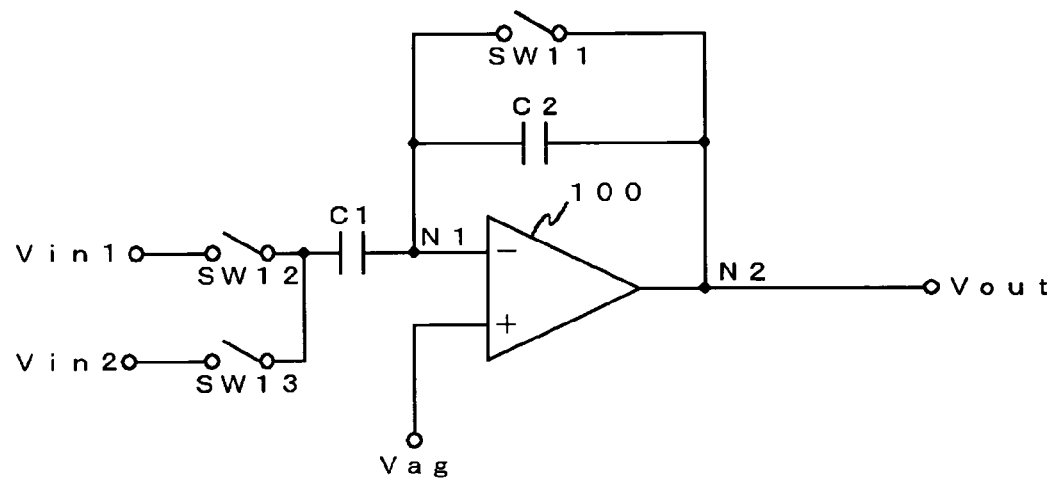
FIG. 3 illustrates a structure of a single-ended switched-capacitor operational amplifier.
Figure 4:
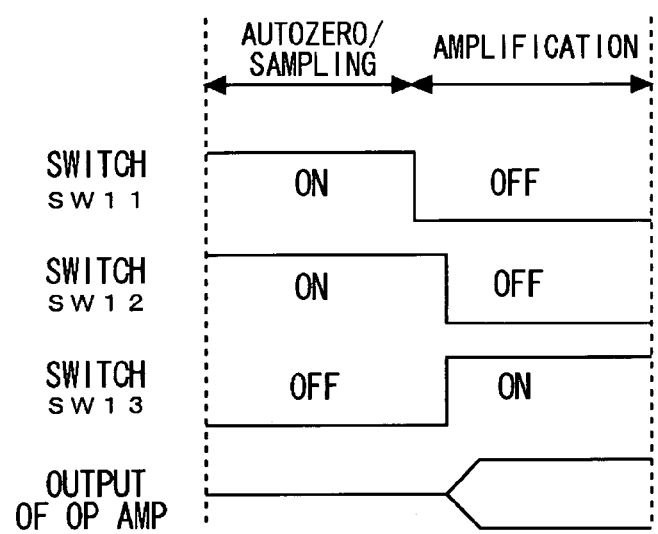
FIG. 4 is a timing chart illustrating an operation of a switched-capacitor operational amplifier.

A description will now be given of a detailed structure of the first amplifier circuit 11, the second amplifier circuit 15, the third amplifier circuit 19 and the fourth amplifier circuit 21. FIG. 3 illustrates a structure in which each of the amplifier circuits is embodied by a single-ended switched-capacitor operational amplifier. FIG. 4 is a timing chart illustrating an operation of a switched-capacitor operational amplifier. Referring to FIG. 3, an input capacitor C1 is connected to the inverting input terminal of an operational amplifier 100. An input voltage Vin1 is fed to the terminal via a Vin1 switch SW12, and an input voltage Vin2 is fed thereto via a Vin2 switch SW13. The input voltage Vin1 represents the input analog signal Vin or the analog signal inputted from the preceding stage. The input voltage Vin2 represents the output analog signal from the first DA converter circuit 13 or the second DA converter circuit 18, or the reference voltage. The noninverting input terminal of the operational amplifier 100 is connected to an autozero potential. The output terminal and the inverting input terminal of the operational amplifier 100 are connected to each other via a feedback capacitor C2. An autozero switch SW4011 is connected externally in parallel to the feedback capacitor C2 to enable short circuit between the output terminal and the inverting input terminal of the operational amplifier 100.

Referring to FIG. 4, a description will now be given of an operation of the single-ended switched-capacitor operational amplifier illustrated in FIG. 3. In order to apply an autozero potential Vag, the autozero switch SW11 is turned on. In this state, an input node N1 and an output node N2 are both at the autozero potential Vag. In order to sample the input voltage Vin1, the Vin1 switch SW12 is turned on and the Vin2 switch SW13 is turned off. At this point of time, the charge QA at the input node N1 is given by the following equation (A1).

$$QA = C1(Vin1 - Vag) \quad (A1)$$

Next, the autozero switch SW11 is turned off in order to enable imaginary ground and amplification. Subsequently, in order to effect subtraction of the input voltage Vin2, the Vin1 switch SW12 is turned off and the Vin2 switch SW13 is turned on. At this point of time, the charge QB at the input node N1 is given by the following equation (A2).

$$QB = C1(Vin2 - Vag) + C2(Vout - Vag) \quad (A2)$$

Since there is no route for the charge to be dissipated through the input node N1, the principle of conservation of charge demands that the following equation (A3) hold.

$$Vout = C1/C2(Vin1 - Vin2) + Vag \quad (A3)$$

Accordingly, if the autozero potential is an ideal ground potential, then the single-ended switched-capacitor operational amplifier is capable of amplifying a difference between the input voltage Vin1 and the input voltage Vin2 according to the capacitance ratio between the input capacitor C1 and the feedback capacitor C2. Even if the autozero potential Vag is not an ideal ground potential, an approximation can be obtained.

Figure 5:
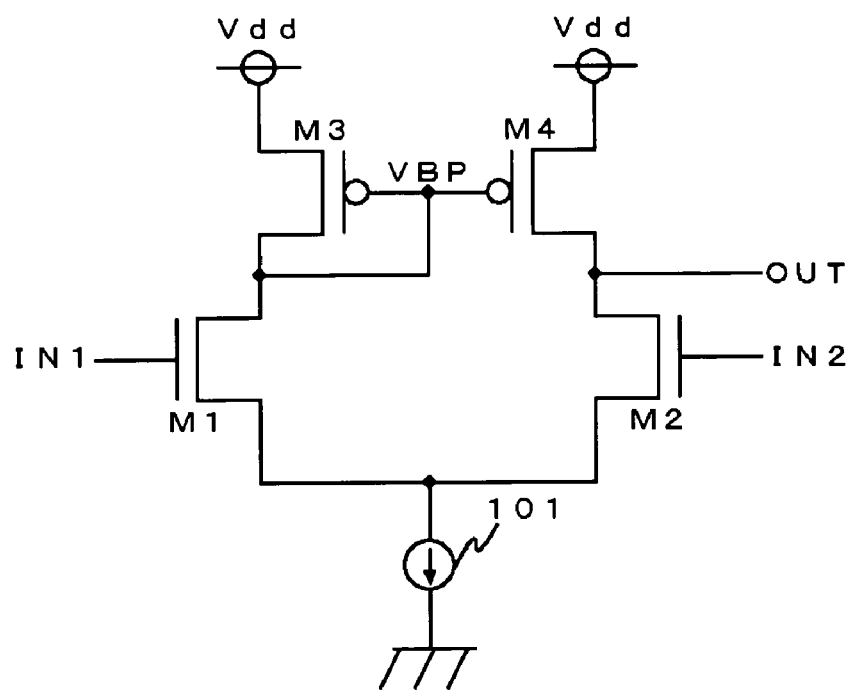
FIG. 5 illustrates an equivalent circuit for a part of a single-ended operational amplifier for differential amplification.

A description will now be given of an example where the operational amplifier 100 is built using a complementary metal-oxide semiconductor (CMOS) process. FIG. 5 illustrates an equivalent circuit for a part of the single-ended operational amplifier 100 for differential amplification. The operational amplifier 100 is provided with P-channel MOS field effect transistors (hereinafter referred to as PMOS transistors) M3 and M4, N-channel MOS field effect transistors (hereinafter referred to as NMOS transistors) M1 and M2, and a constant current source 101.

A pair of PMOS transistors M3 and M4 are supplied with a power supply voltage Vdd at the drains thereof and a bias voltage at the gates thereof. The pair of PMOS transistors M3 and M4 constitute a current mirror circuit and drain currents of an identical level flow in the sources thereof. The drains of a pair of NMOS transistors M1 and M2 are connected to the pair of PMOS transistors M3 and M4, respectively, and the sources of the transistors M1 and M2 are connected to the constant current source 101. Differential inputs IN1 and IN2 are fed to the gates of the transistors M1 and M2, respectively. An output OUT is obtained from a node between the PMOS transistor M4 and the NMOS transistor M2. The gain is determined by the mutual conductance and output resistance of the NMOS transistors M1 and M2, and the PMOS transistors M3 and M4. The constant current source 101 may be embodied by an NMOS transistor. The NMOS transistor is supplied with a bias voltage at the gate thereof and is operated in a saturation zone.

Figure 6:
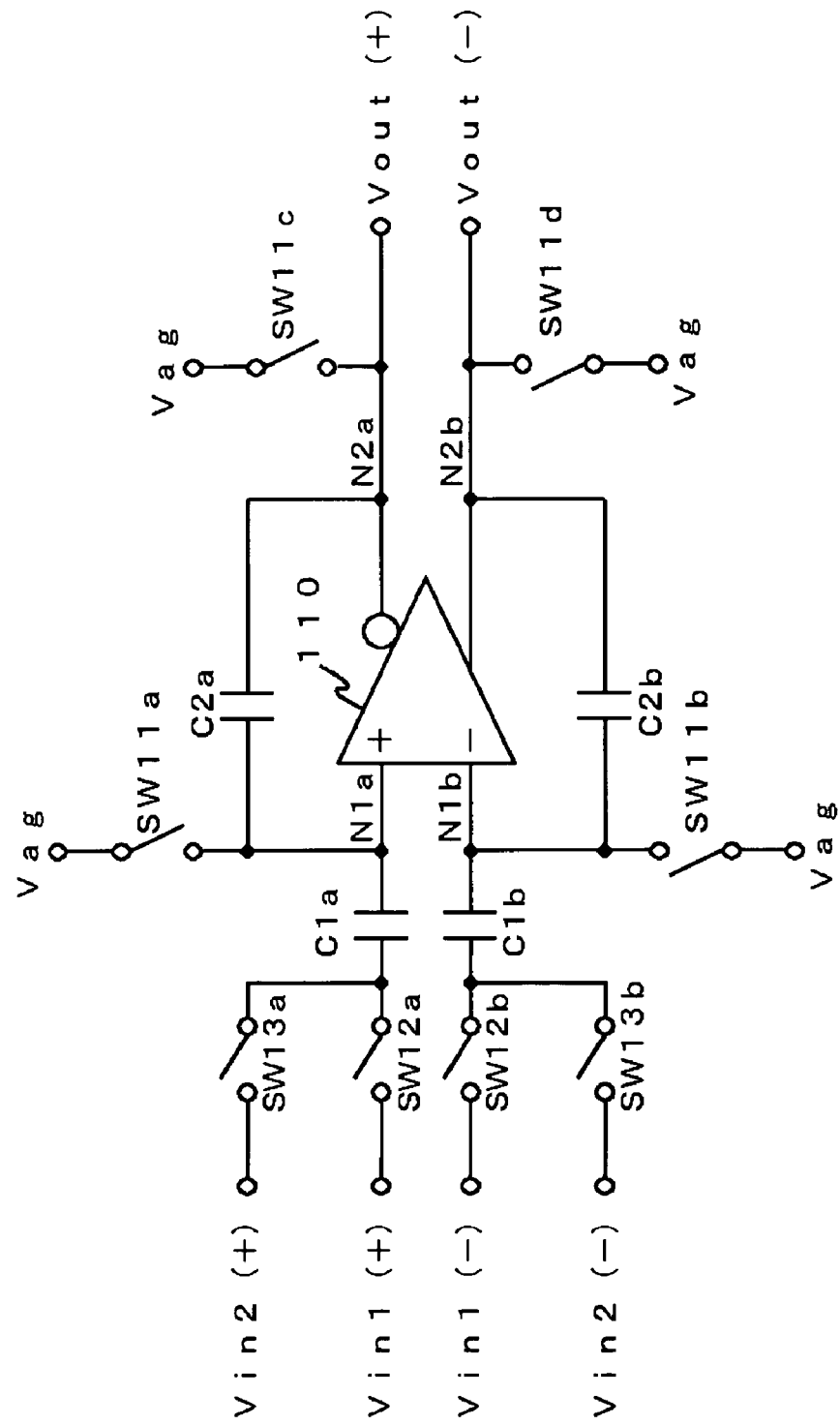
FIG. 6 illustrates a structure of a fully differential switched-capacitor operational amplifier.

FIG. 6 illustrates a structure in which an amplifier circuit is implemented by a fully differential switched-capacitor operational amplifier. In comparison with the single-ended configuration, the fully differential configuration is more tolerant of noise and the output amplitude thereof may be relatively large. Referring to FIG. 6, an input capacitor C1a is connected to the noninverting input terminal of an operational amplifier 110. An input voltage Vin1(+) is fed via a Vin1 switch SW12a and an input voltage Vin2(+) is fed via a Vin2 switch SW13a. An input capacitor C1b is connected to the inverting input terminal of the operational amplifier 110. An input voltage Vin1(−) is fed via a Vin1 switch SW12b and an input voltage Vin2(−) is fed via a Vin2 switch SW13b. The inverting output terminal and the noninverting input terminal of the operational amplifier 110 are connected to each other via a feedback capacitor C2a. The noninverting output terminal and the inverting input terminal of the operational amplifier 110 are connected to each other via a feedback capacitor C2b. Autozero switches SW11a and SW11b and SW11c and SW11d are connected to the input nodes N1a and N1b, and the output nodes N2a and N2b, respectively. The autozero switches SW11a to SW11d are operated according to the same timing schedule. When the switches are turned on, the input nodes N1a and N1b, and the output nodes N2a and N2b are brought to the autozero potential Vag.

A description will now be given of an operation of the fully differential switched-capacitor operational amplifier of FIG. 6. The operation timing is the same as that of FIG. 4. In order to apply the autozero potential Vag, the autozero switches SW11a to SW11d are turned on. In this state, the input nodes N1a and N1b, and the output nodes N2a and N2b are at the autozero potential Vag. In order to sample the input voltage Vin1, the Vin1 switches SW12a and SW12b are turned on and the Vin2 switches SW13a and SW13b are turned off. At this point of time, the charge QAA at the input node N1a is given by the following equation (A4) and the charge QAB at the input node N1b is given by the following equation (A5).

$$QAA = C1\{Vin1(+) - Vag\} \quad (A4)$$

$$QAB = C1\{Vin1(-) - Vag\} \quad (A5)$$

The autozero switches SW11a to SW11d are then turned off in order to enable imaginary ground and amplification. Subsequently, in order to effect subtraction of the input voltage Vin2, the Vin1 switches SW12a and SW12b are turned off and the Vin2 switches SW13a and SW13b are turned on. At this point of time, the charge QBA at the input node N1a is given by the following equation (A6) and the charge QBB at the input node N1b is given by the following equation (A7).

$$QBA = C1\{Vin2(+) - Vag\} + C2\{Vout(+) - Vag\} \quad (A6)$$

$$QBB = C1\{Vin2(-) - Vag\} + C2\{Vout(-) - Vag\} \quad (A7)$$

Since there are no routes at the input end nodes N1 for dissipating the charge, the principle of conservation of charge demands that QAA=QBA and QAB=QBB, so that the following equations (A8) and (A9) hold.

$$Vout(+) = C1/C2\{Vin1(+) - Vin2(+)\} + Vag \quad (A8)$$

$$Vout(-) = C1/C2\{Vin1(-) - Vin2(-)\} + Vag \quad (A9)$$

The voltage difference Vout between the two output nodes N2a and N2b is given by the following equation (A10).

$$Vout = Vout(+) - Vout(-) = C1/C2[\{Vin1(+) - Vin1(-)\} - \{Vin2(+) - Vin2(-)\}] \quad (A10)$$

Accordingly, the fully differential switched-capacitor operational amplifier is capable of amplifying a difference between the input voltage Vin1(+) and the input voltage Vin2(+), and the difference between the input voltage Vin1(−) and the input voltage Vin2(−), according to the capacitance ratio occurring between the input capacitors C1a, C1b and the feedback capacitors C2a, C2b, respectively.

Figure 7:
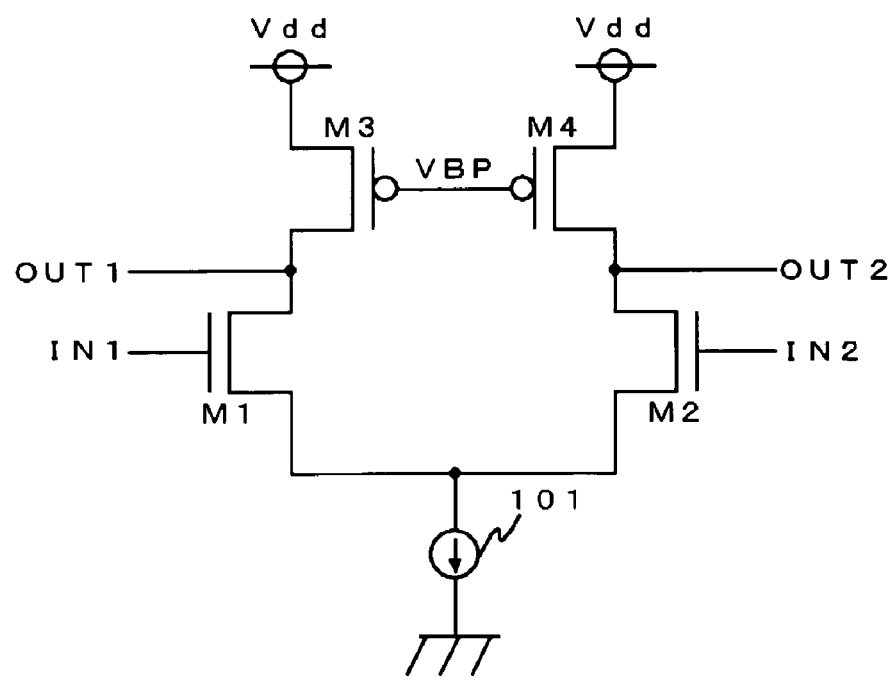
FIG. 7 illustrates an equivalent circuit for a part of a fully differential operational amplifier for differential amplification.

FIG. 7 illustrates an equivalent circuit for a part of the fully differential operational amplifier 110 for differential amplification. The description given above with reference to FIG. 5 also applies to FIG. 7. Differential outputs OUT1 and OUT2 are obtained from a node between the PMOS transistor M3 and the NMOS transistor M1, and a node between the PMOS transistor M4 and the NMOS transistor M2. A through current flows from the power supply toward the ground.

Next, a description will be given of the arrangement patterns of the first amplifier circuit 11, the second amplifier circuit 15, the third amplifier circuit 19 and the fourth amplifier circuit 21. In the converter circuit shown in FIG. 1, the degree of precision required by the first amplifier circuit 11, the second amplifier circuit 15, the third amplifier circuit 19 and the fourth amplifier circuit 21 generally matches with the sequence in which the analog signal is conveyed. That is, the level of accuracy required by the respective amplifier circuits is in the descending order of the first amplifier circuit 11, the second amplifier circuit 15, the third amplifier circuit 19 and the fourth amplifier circuit 21. This is because a higher precision is required in order to convert into relatively higher bits.

Figure 8:
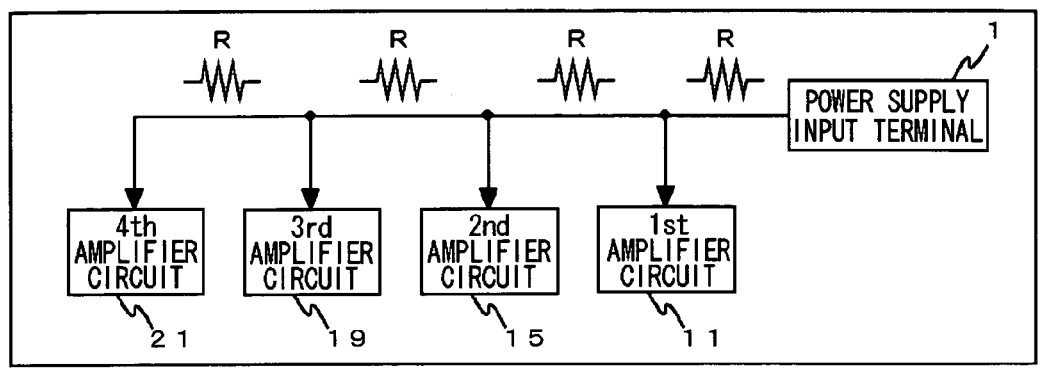
FIG. 8 conceptually illustrates a first arrangement pattern of amplifier circuits according to a first embodiment.

FIG. 8 conceptually illustrates a first arrangement pattern of a plurality of amplifier circuits according to the first embodiment. When an AD converter is structured as an integrated circuit, an external power source is connected to a power supply input terminal 1. Within the integrated circuit, the constituent elements thereof are supplied with power via power supply wiring from the power supply input terminal 1. The power supply wiring includes resistance components R, and the longer they are, the greater the supply voltage drop will be. In FIG. 8, a plurality of amplifier circuits are arranged in the order of a first amplifier circuit 11, a second amplifier circuit 15, a third amplifier circuit 19 and a fourth amplifier circuit 21 from the power supply input terminal 1. The first amplifier circuit 11, which needs to perform with the highest accuracy, is placed closest to the power supply input terminal 1. Hence, there is the smallest resistance component R in the power supply wiring for the first amplifier circuit 11. That is, the first amplifier circuit 11 can receive a power supply voltage with the smallest voltage drop, which contributes to an improvement in the accuracy and speed of the AD converter as a whole.

Figure 9:
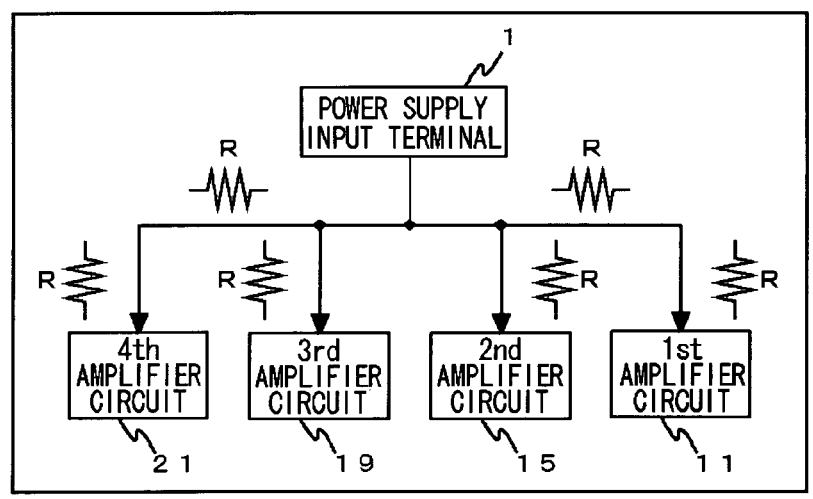
FIG. 9 conceptually illustrates an arrangement pattern of amplifier circuits as an example for comparison with the first arrangement pattern.

FIG. 9 conceptually illustrates an arrangement pattern of a plurality of amplifier circuits as an example for comparison with the first arrangement pattern. In FIG. 9, a first amplifier circuit 11, a second amplifier circuit 15, a third amplifier circuit 19 and a fourth amplifier circuit 21 are disposed at substantially equal distance from a power supply input terminal 1, and therefore the wiring length thereto is also nearly equal. Accordingly, the power supply voltage supplied to the first amplifier circuit 11, the second amplifier circuit 15, the third amplifier circuit 19 and the fourth amplifier circuit 21 is also approximately equal to one another. Here, if the bias current as shown in FIG. 5 or FIG. 7 becomes small due to a drop in the power supply voltage supplied to these amplifier circuits, then the operation speed of operational amplifiers 100 and 110 may drop. Moreover, if there occurs a difference in power supply voltage or grounding voltage at the bias generator generating this bias current and the differential amplifier, degradation may be caused in DC gain or output voltage range. In this example for comparison, such phenomena occur nearly equally to the first amplifier circuit 11, the second amplifier circuit 15, the third amplifier circuit 19 and the fourth amplifier circuit 21. A measure to suppress and even prevent such phenomena may be an increase in the width of power supply wiring, but such a measure may also result in an increase in circuit area.

In the case of the first arrangement pattern shown in FIG. 8, however, phenomena such as mentioned above seldom occur to the first amplifier circuit 11, but an increasing degree of such phenomena may occur closer to the fourth amplifier circuit 21. With an AD converter as shown in FIG. 1, the accuracy required by the plurality of amplifier circuits decreases in the order of the first amplifier circuit 11, the second amplifier circuit 15, the third amplifier circuit 19 and the fourth amplifier circuit 21, and therefore the first arrangement pattern as shown in FIG. 8, which features a high precision of the first amplifier circuit 11, is better in improving the accuracy and speed of the AD converter as a whole than the arrangement pattern in the example for comparison.

Figure 10:
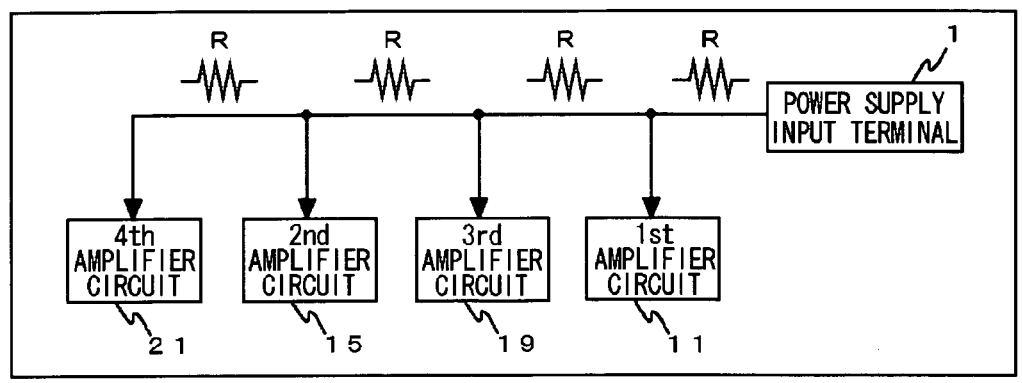
FIG. 10 conceptually illustrates a second arrangement pattern of amplifier circuits according to a first embodiment.

FIG. 10 conceptually illustrates a second arrangement pattern of a plurality of amplifier circuits according to the first embodiment. The accuracy required by a first amplifier circuit 11, a second amplifier circuit 15, a third amplifier circuit 19 and a fourth amplifier circuit 21 is not necessarily in the descending order along the path through which an analog signal is conveyed. For example, where the gain of the third amplifier circuit 19 is made higher and that of the second amplifier circuit 15 lower by, for instance, changing the number of bits to be converted, it is preferable that a power supply voltage with higher accuracy be supplied to the third amplifier circuit 19 than to the second amplifier circuit 15 if a high-speed operation of the AD converter as a whole is to be realized thereby. In such a case, the plurality of amplifier circuits are arranged in the order of the first amplifier circuit 11, the third amplifier circuit 19, the second amplifier circuit 15 and the fourth amplifier circuit 0.21 from the power supply input terminal 1, as shown in FIG. 10. In this manner, the plurality of amplifier circuits may be arranged from the side of the power supply input terminal 1 not necessarily in the descending order along the path of an analog signal but in the descending order of accuracy required by the amplifier circuits.

Figure 11:
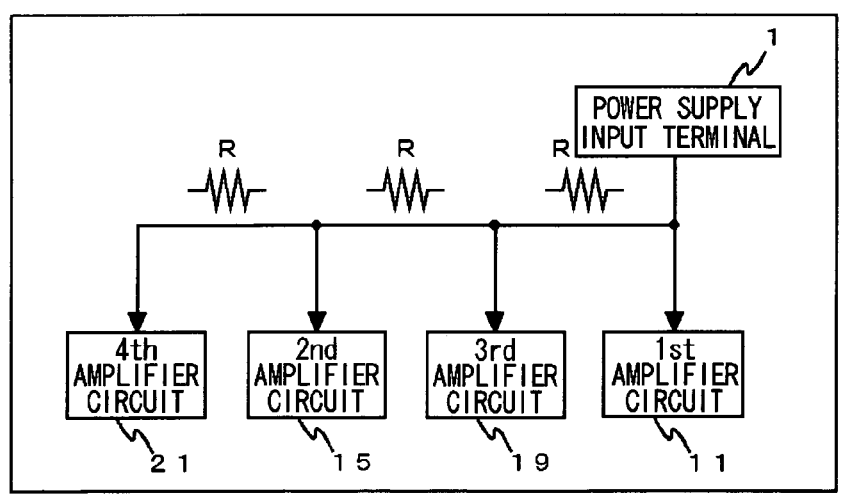
FIG. 11 conceptually illustrates a third arrangement pattern of amplifier circuits according to a first embodiment.

FIG. 11 conceptually illustrates a third arrangement pattern of a plurality of amplifier circuits according to the first embodiment. As is shown in FIG. 11, the power supply input terminal 1 may be disposed in either a vertical direction or a horizontal direction on the integrated circuit.

Figure 12:
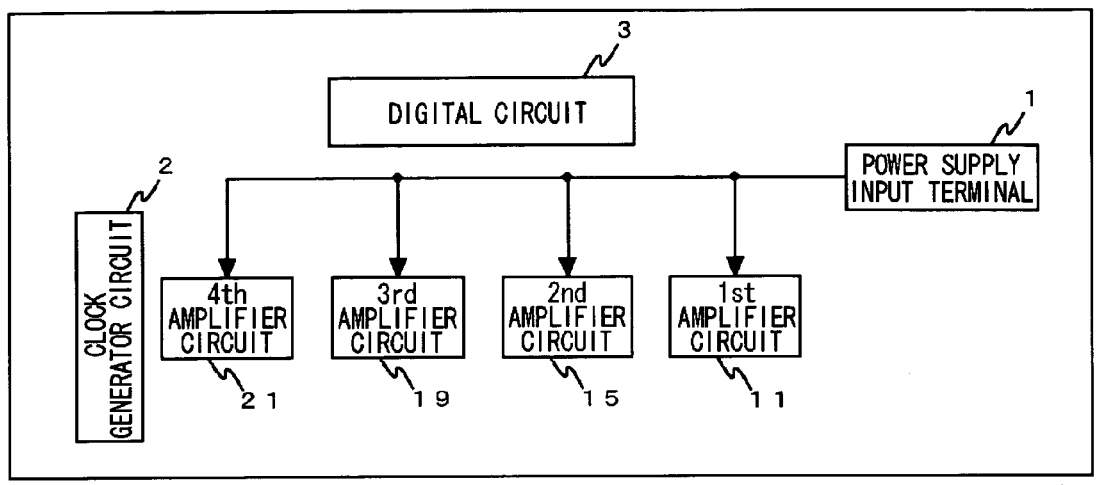
FIG. 12 conceptually illustrates a fourth arrangement pattern of amplifier circuits according to a first embodiment.

FIG. 12 conceptually illustrates a fourth arrangement pattern of a plurality of amplifier circuits according to the first embodiment. A clock generator circuit 2 and a digital circuit 3 can be noise sources. The clock generator circuit 2 generates a clock signal and thus provides an operation timing to at least a first amplifier circuit 11, a second amplifier circuit 15, a third amplifier circuit 19 and a fourth amplifier circuit 21. The clock generator 2 provides timing for autozero operation and amplification operation as shown in FIG. 4. In order to drive the load created by clock wiring and gate capacitance, the clock generator circuit 2 includes a number of logic elements such as inverters employing large-size transistors. When such an inverter is structured as a push-pull circuit with two transistors connected in series, there may be cases where a large through current flows at the time of transition from low to high level or high to low level. This through current, when injected into the substrate, becomes a large noise component. Even when the substrate is provided with a trap, the noise component may sometimes spread beyond the trap. These noise components can cause changes in the substrate potential of the elements such as MOS transistors M1 to M4 which constitute operational amplifiers 100 and 110 as shown in FIG. 5 or FIG. 7, and they become the cause of reducing the accuracy or speed of the first amplifier circuit 11, the second amplifier circuit 15, the third amplifier circuit 19 and the fourth amplifier circuit 21.

The digital circuit 3, which is a circuit for performing various digital signal processings, may be an encoder for turning digital values produced by a first AD converter circuit 12 or a second AD converter circuit 17 into binary codes, a latch circuit for adjusting the output timing of different stages or the like. The digital circuit 3 also produces a noise component. This noise, however, is not so large as that from the clock generator circuit 2 because the digital circuit 3 does not operate on so heavy a current as the clock generator circuit 2.

In FIG. 12, a plurality of amplifier circuits are arranged in the order of a fourth amplifier circuit 21, a third amplifier circuit 19, a second amplifier circuit 15 and a first amplifier circuit 11 from the side of a clock generator circuit 2. Contrary to this, the arrangement is in the order of the first amplifier circuit 11, the second amplifier circuit 15, the third amplifier circuit 19 and the fourth amplifier circuit 21 from the side of a power supply input terminal 1. The first amplifier circuit 11, which needs to perform with the highest accuracy, is placed in a position farthest from the clock generator circuit 2. The noise component transmitted through the substrate gets smaller as it goes farther from the noise source because the resistance component of the substrate and capacitance components, such as parasitic capacitance and line capacitance, produce the effect of a low-pass filter. Hence, the first amplifier circuit 11 is the least subject to the effect of the noise component. At the same time, the first amplifier circuit 11, which is located closest to the power supply input terminal 1, is supplied with a power supply voltage with the greatest accuracy. Also, the order of arrangement of the fourth amplifier circuit 21, the third amplifier circuit 19, the second amplifier circuit 15 and the first amplifier circuit 11 should not necessarily be an order opposite to the passage of an analog signal but may be any other so long as accuracy is not a prerequisite.

Figure 13:
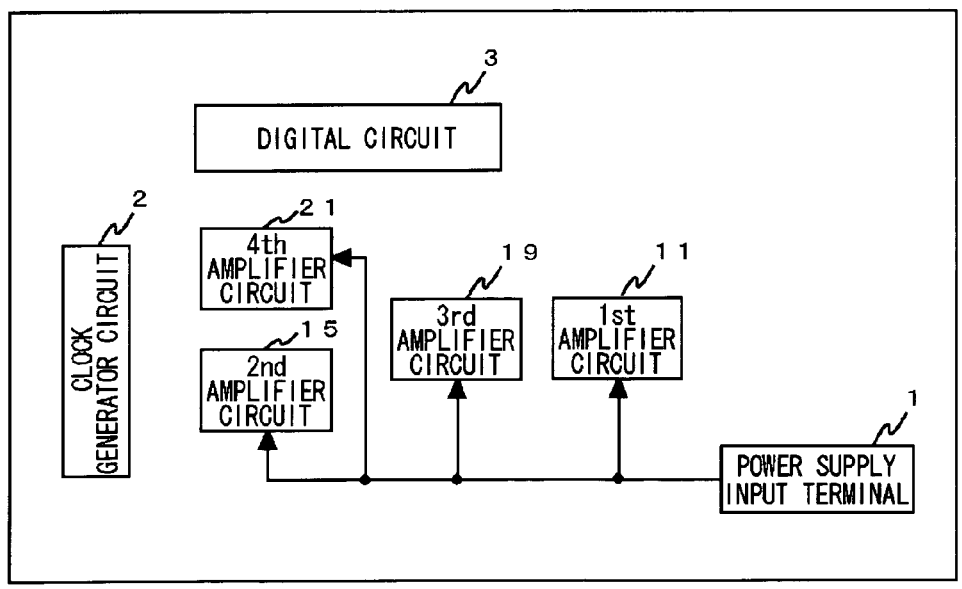
FIG. 13 conceptually illustrates a fifth arrangement pattern of amplifier circuits according to a first embodiment.

FIG. 13 conceptually illustrates a fifth arrangement pattern of a plurality of amplifier circuits according to the first embodiment. In FIG. 13, a first amplifier circuit 11, which is required to perform with the highest accuracy, is placed in a position farthest from a clock generator circuit 2 and a digital circuit 3 and closest to a power supply input terminal 1. A second amplifier circuit 15 is placed in a position away from the power supply input terminal 1 and the digital circuit 3 and closest to the clock generator circuit 2. A third amplifier circuit 19 is placed medium distances away from the power supply input terminal 1, the clock generator circuit 2 and the digital circuit 3. And a fourth amplifier circuit 21, which can operate with the lowest accuracy, is placed in a position closest to the clock generator circuit 2 and the digital circuit 3 and farthest from the power supply input terminal 1. The fifth arrangement pattern like this assures the highest accuracy for the first amplifier circuit 11, thus improving the accuracy and speed of the AD converter as a whole.

Figure 14:
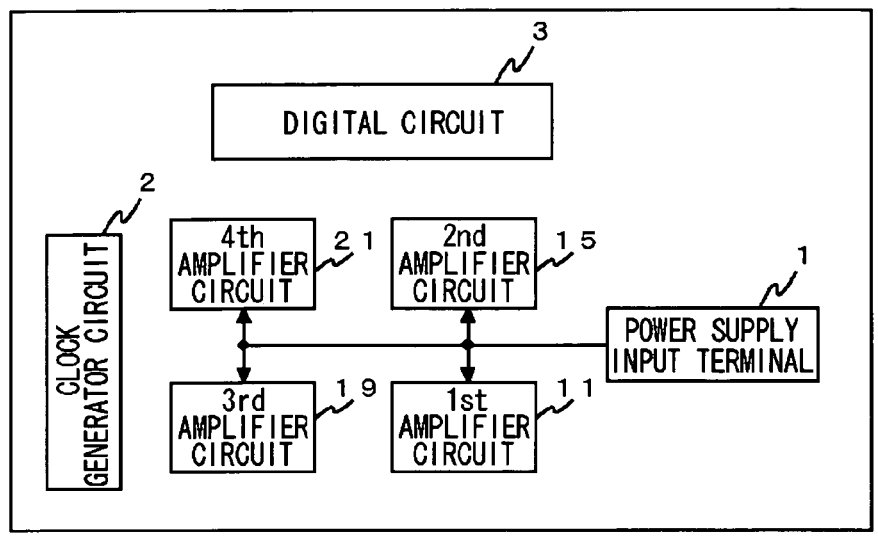
FIG. 14 conceptually illustrates a sixth arrangement pattern of amplifier circuits according to a first embodiment.

FIG. 14 conceptually illustrates a sixth arrangement pattern of a plurality of amplifier circuits according to the first embodiment. In FIG. 14, a first amplifier circuit 11, which is required to perform with the highest accuracy, is placed in a position farthest from a clock generator circuit 2 and a digital circuit 3 and closest to a power supply input terminal 1. A second amplifier circuit 15 is placed in a position farthest from the clock generator circuit 2 and closest to the power supply input terminal 1 and the digital circuit 3. A third amplifier circuit 19 is placed in a position farthest from the digital circuit 3 and the power supply input terminal 1 and closest to the clock generator circuit 2. And a fourth amplifier circuit 21, which can operate with the lowest accuracy, is placed in a position closest to the clock generator circuit 2 and the digital circuit 3 and farthest from the power supply input terminal 1. The sixth arrangement pattern like this assures the highest accuracy for the first amplifier circuit 11, thus improving the accuracy and speed of the AD converter as a whole. As seen in the fifth and the sixth arrangement pattern, the arrangement pattern of a first amplifier circuit 11, a second amplifier circuit 15, a third amplifier circuit 19 and a fourth amplifier circuit 21 can be set flexibly relative to a power supply input terminal 1, a clock generator circuit 2 and a digital circuit 3, depending on the accuracy required by the respective amplifier circuits.

Figure 15:
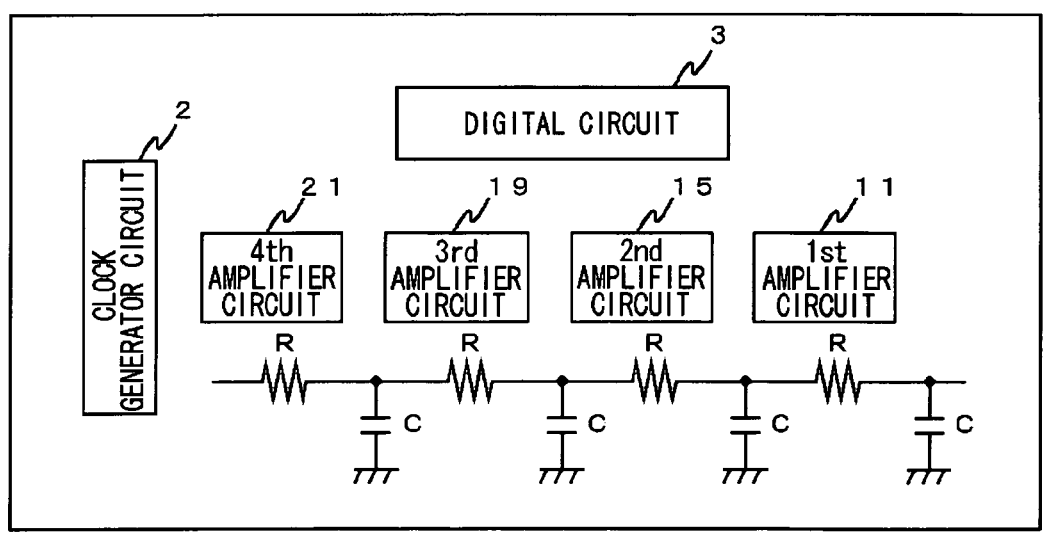
FIG. 15 conceptually illustrates a seventh arrangement pattern of amplifier circuits according to a first embodiment.

FIG. 15 conceptually illustrates a seventh arrangement pattern of a plurality of amplifier circuits according to the first embodiment. A clock generator circuit 2 and a digital circuit 3 can be noise sources. The clock generator circuit 2 generates a clock signal and thus provides an operation timing to at least a first amplifier circuit 11, a second amplifier circuit 15, a third amplifier circuit 19 and a fourth amplifier circuit 21. The clock generator circuit 2 provides timing for autozero operation and amplification operation as shown in FIG. 4. In order to drive the load created by clock wiring and gate capacitance, the clock generator circuit 2 includes a number of logic elements such as inverters employing large-size transistors. When such an inverter is structured as a push-pull circuit with two transistors connected in series, there may be cases where a large through current flows at the time of transition from low to high level or high to low level. This through current, when injected into the substrate, becomes a large noise component. Even when the substrate is provided with a trap, the noise component may sometimes spread beyond the trap. These noise components can cause changes in the substrate potential of the elements such as MOS transistors M1 to M4 which constitute operational amplifiers 100 and 110 as shown in FIG. 5 or FIG. 7, and they become the cause of reducing the accuracy or speed of the first amplifier circuit 11, the second amplifier circuit 15, the third amplifier circuit 19 and the fourth amplifier circuit 21.

The digital circuit 3, which is a circuit for performing various digital signal processings, may be an encoder for turning digital values produced by a first AD converter circuit 12 or a second AD converter circuit 17 into binary codes, a latch circuit for adjusting the output timing of different stages or the like. The digital circuit 3 also produces a noise component. This noise, however, is not so large as that from the clock generator circuit 2 because the digital circuit 3 does not operate on so heavy a current as the clock generator circuit 2.

In FIG. 15, a plurality of amplifier circuits are arranged in the order of a fourth amplifier circuit 21, a third amplifier circuit 19, a second amplifier circuit 15 and a first amplifier circuit 11 from the side of the clock generator circuit 2. The first amplifier circuit 11, which needs to perform with the highest accuracy, is placed in a position farthest from the clock generator circuit 2. The noise component transmitted through the substrate gets smaller as it goes farther from the noise source because the resistance components R of the substrate and capacitance components C, such as parasitic capacitance and line capacitance, produce the effect of a low-pass filter. Hence, the first amplifier circuit 11 is the least subject to the effect of the noise component. The above-described order of arrangement is opposite to the passage of an analog signal. As a result, the effect of the noise components diminishes in the order of the first amplifier circuit 11, the second amplifier circuit 15, the third amplifier circuit 19 and the fourth amplifier circuit 21.

Figure 16:
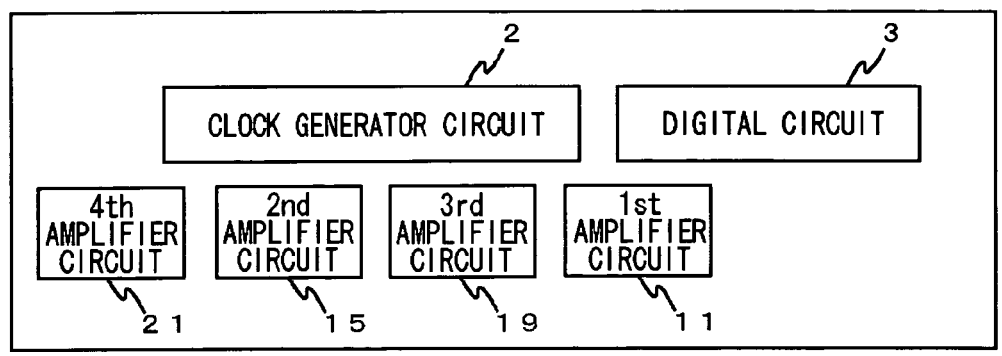
FIG. 16 conceptually illustrates an arrangement pattern of amplifier circuits as an example for comparison with the seventh arrangement pattern.

FIG. 16 conceptually illustrates an arrangement pattern of a plurality of amplifier circuits as an example for comparison with the seventh arrangement pattern. In FIG. 16, a first amplifier circuit 11, a second amplifier circuit 15, a third amplifier circuit 19 and a fourth amplifier circuit 21 are disposed in a position to receive clock control at approximately equal clock wiring lengths from a clock generator circuit 2. This arrangement reduces phase differences between clock signals sent to the first amplifier circuit 11, the second amplifier circuit 15, the third amplifier circuit 19 and the fourth amplifier circuit 21. The first amplifier circuit 11, the second amplifier circuit 15, the third amplifier circuit 19 and the fourth amplifier circuit 21 are subject to an approximately equal effect of noise component from the clock generator circuit 2. If the bias current as shown in FIG. 5 or FIG. 7 becomes small due to the effect of this noise component, then the operation speed of operational amplifiers 100 and 110 may drop. Moreover, if there occurs a difference in power supply voltage or grounding voltage at the bias generator generating this bias current and the differential amplifier, degradation may be caused in DC gain or output voltage range. In this example for comparison, such phenomena may occur nearly equally to the first amplifier circuit 11, the second amplifier circuit 15, the third amplifier circuit 19 and the fourth amplifier circuit 21.

In the case of the arrangement pattern shown in FIG. 15, however, phenomena as described above seldom occur to the first amplifier circuit 11, but an increasing degree of such phenomena may occur closer to the fourth amplifier circuit 21. With an AD converter as shown in FIG. 1, the accuracy required by the plurality of amplifier circuits decreases in the order of the first amplifier circuit 11, the second amplifier circuit 15, the third amplifier circuit 19 and the fourth amplifier circuit 21, and therefore the seventh arrangement pattern as shown in FIG. 15, which features a high accuracy of the first amplifier circuit 11, is better in improving the accuracy and speed of the AD converter as a whole than the arrangement pattern in the example for comparison.

Figure 17:
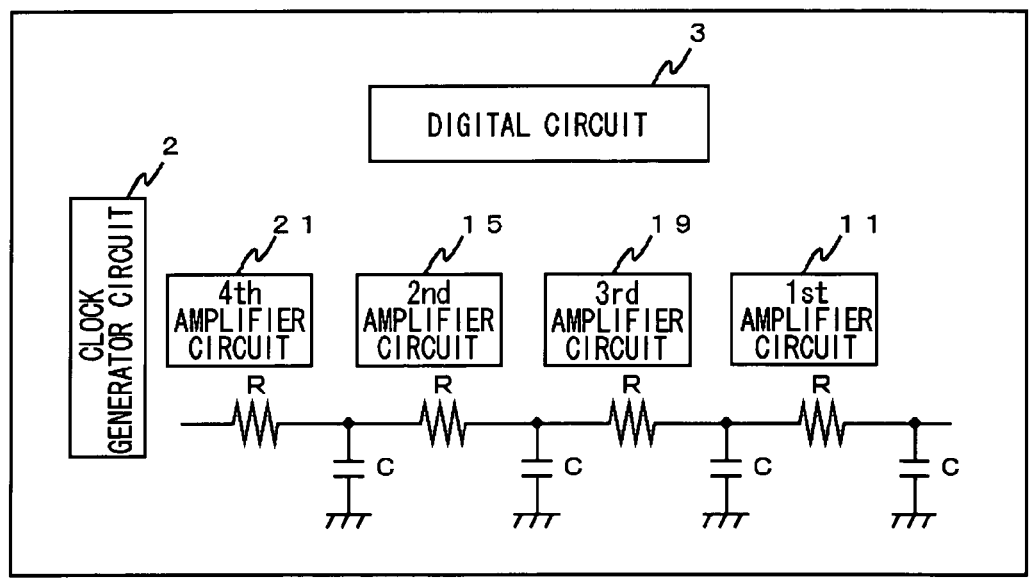
FIG. 17 conceptually illustrates an eighth arrangement pattern of amplifier circuits according to a first embodiment.

FIG. 17 conceptually illustrates an eighth arrangement pattern of a plurality of amplifier circuits according to the first embodiment. The accuracy required by a first amplifier circuit 11, a second amplifier circuit 15, a third amplifier circuit 19 and a fourth amplifier circuit 21 is not necessarily in the descending order along the path through which an analog signal is conveyed. For example, where the gain of the third amplifier circuit 19 is made higher and that of the second amplifier circuit 15 lower by, for instance, changing the number of bits to be converted, it is preferable that a power supply voltage with higher accuracy be supplied to the third amplifier circuit 19 than to the second amplifier circuit 15 if a high-speed operation of the AD converter as a whole is to be realized thereby. In such a case, the plurality of amplifier circuits are arranged in the order of the fourth amplifier circuit 21, the second amplifier circuit 15, the third amplifier circuit 19 and the first amplifier circuit 11 from the side of the clock generator circuit 2, as shown in FIG. 17. In this manner, the plurality of amplifier circuits can be arranged not necessarily in the descending order along the path of an analog signal but also in the order opposite to the order of accuracy required relative to the clock generator circuit 2.

Figure 18:
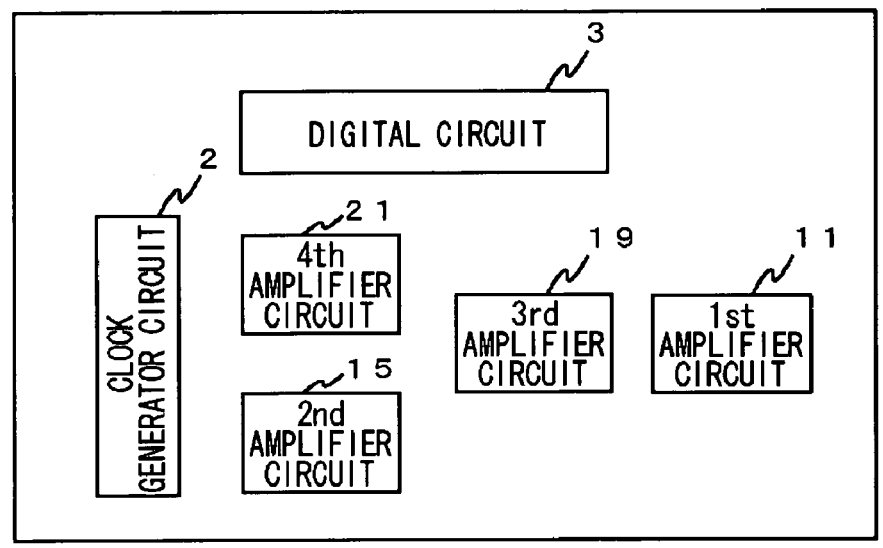
FIG. 18 conceptually illustrates a ninth arrangement pattern of amplifier circuits according to a first embodiment.

FIG. 18 conceptually illustrates a ninth arrangement pattern of a plurality of amplifier circuits according to the first embodiment. In FIG. 18, a first amplifier circuit 11, which is required to perform with the highest accuracy, is placed in a position farthest from a clock generator circuit 2 and a digital circuit 3. A second amplifier circuit 15 is placed in a position away from the digital circuit 3 and closest to the clock generator circuit 2. A third amplifier circuit 19 is placed medium distances away from the clock generator circuit 2 and the digital circuit 3. And a fourth amplifier circuit 21, which can operate with the lowest accuracy, is placed in a position closest to the clock generator circuit 2 and the digital circuit 3. The ninth arrangement pattern like this assures the highest accuracy for the first amplifier circuit 11, thus improving the accuracy and speed of the AD converter as a whole.

Figure 19:
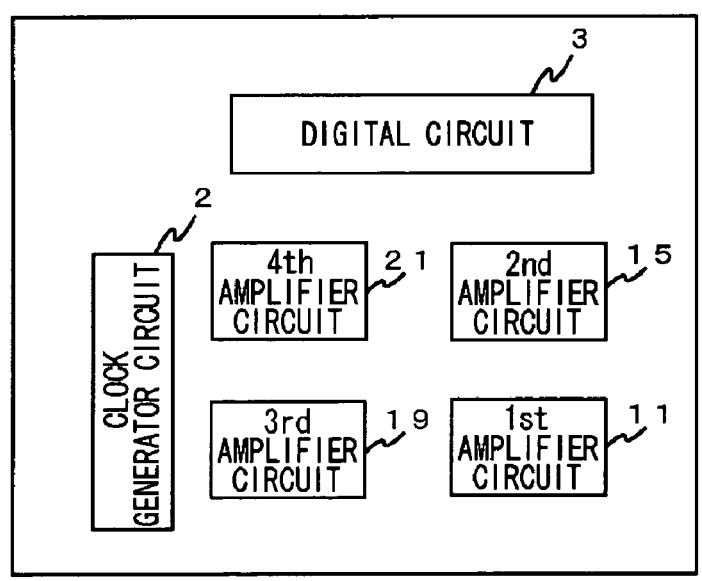
FIG. 19 conceptually illustrates a tenth arrangement pattern of amplifier circuits according to a first embodiment.

FIG. 19 conceptually illustrates a tenth arrangement pattern of a plurality of amplifier circuits according to the first embodiment. In FIG. 19, a first amplifier circuit 11, which is required to perform with the highest accuracy, is placed in a position farthest from a clock generator circuit 2 and a digital circuit 3. A second amplifier circuit 15 is located in a position farthest from the clock generator circuit 2 and closest to the digital circuit 3. A third amplifier circuit 19 is placed in a position farthest from the digital circuit 3 and closest to the clock generator circuit 2. And a fourth amplifier circuit 21, which can operate with the lowest accuracy, is located in a position closest to the clock generator circuit 2 and the digital circuit 3. The tenth arrangement pattern like this assures the highest accuracy for the first amplifier circuit 11, thus improving the accuracy and speed of the AD converter as a whole. As seen in the ninth and the tenth arrangement pattern, the arrangement pattern of a first amplifier circuit 11, a second amplifier circuit 15, a third amplifier circuit 19 and a fourth amplifier circuit 21 can be set flexibly relative to a clock generator circuit 2 and a digital circuit 3, depending on the accuracy required by the respective amplifier circuits.

Figure 20:
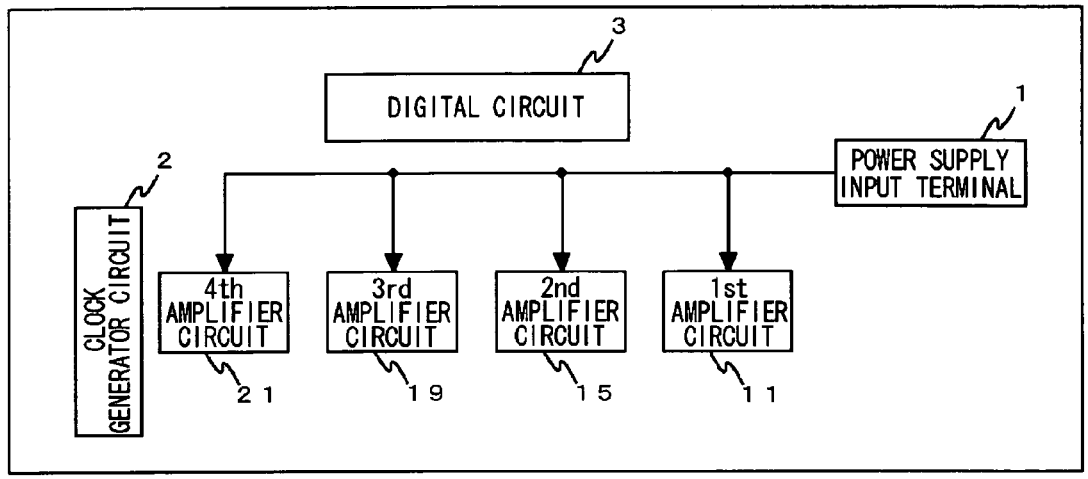
FIG. 20 conceptually illustrates an eleventh arrangement pattern of amplifier circuits according to a first embodiment.

FIG. 20 conceptually illustrates an eleventh arrangement pattern of a plurality of amplifier circuits according to the first embodiment. When an AD converter is structured as an integrated circuit, an external power source is connected to a power supply input terminal 1. Within the integrated circuit, the constituent elements thereof are supplied with power via power supply wiring from the power supply input terminal 1. The power supply wiring includes resistance components, and the longer they are, the greater the supply voltage drop will be.

In FIG. 20, a plurality of amplifier circuits are arranged in the order of a fourth amplifier circuit 21, a third amplifier circuit 19, a second amplifier circuit 15 and a first amplifier circuit 11 from the side of a clock generator circuit 2. Contrary to this, the arrangement is in the order of the first amplifier circuit 11, the second amplifier circuit 15, the third amplifier circuit 19 and the fourth amplifier circuit 21 from the side of the power supply input terminal 1. The first amplifier circuit 11, which needs to perform with the highest accuracy, is located in a position farthest from the clock generator circuit 2. At the same time, the first amplifier circuit 11, which is placed closest to the power supply input terminal 1, is subject to the smallest resistance component in power supply wiring and is thus supplied with a power supply voltage with the smallest voltage drop. The order of arrangement of the fourth amplifier circuit 21, the third amplifier circuit 19, the second amplifier circuit 15 and the first amplifier circuit 11 should not necessarily be an order opposite to the passage of an analog signal but may be any other on condition that accuracy is not a prerequisite.

Figure 21:
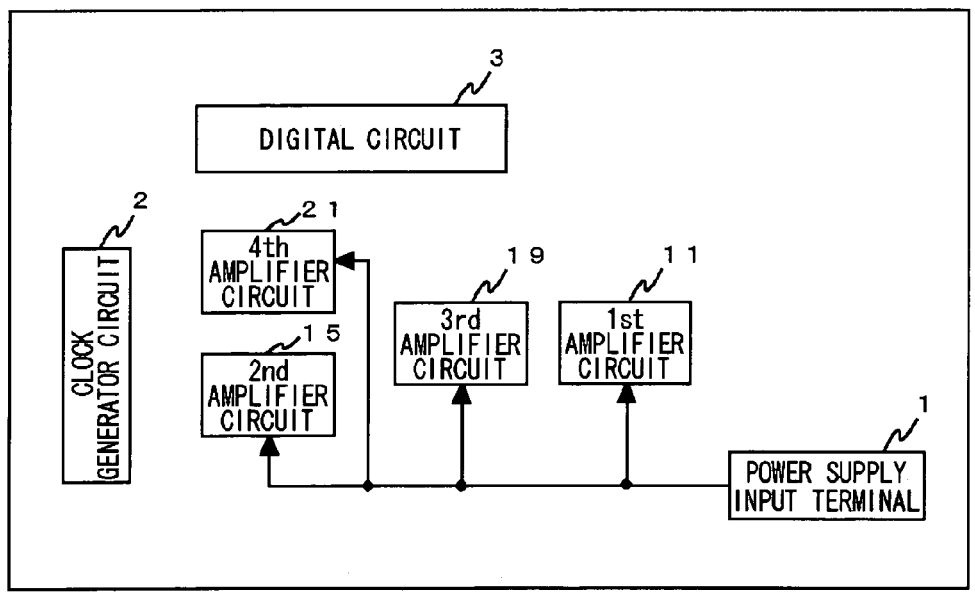
FIG. 21 conceptually illustrates a twelfth arrangement pattern of amplifier circuits according to a first embodiment.

FIG. 21 conceptually illustrates a twelfth arrangement pattern of a plurality of amplifier circuits according to the first embodiment. In FIG. 21, a first amplifier circuit 11, which is required to perform with the highest accuracy, is placed in a position farthest from a clock generator circuit 2 and a digital circuit 3 and closest to a power supply input terminal 1. A second amplifier circuit 15 is placed in a position away from the power supply input terminal 1 and the digital circuit 3 and closest to the clock generator circuit 2. A third amplifier circuit 19 is placed medium distances away from the power supply input terminal 1, the clock generator circuit 2 and the digital circuit 3. And a fourth amplifier circuit 21, which can operate with the lowest accuracy, is located in a position closest to the clock generator circuit 2 and the digital circuit 3 and farthest from the power supply input terminal 1. The twelfth arrangement pattern like this assures the highest accuracy for the first amplifier circuit 11, thus improving the accuracy and speed of the AD converter as a whole.

Figure 22:
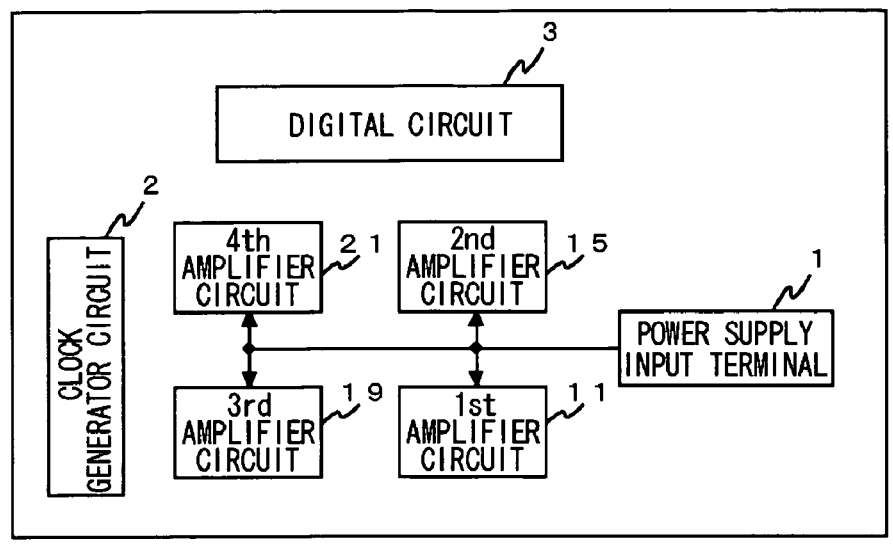
FIG. 22 conceptually illustrates a thirteenth arrangement pattern of amplifier circuits according to a first embodiment.

FIG. 22 conceptually illustrates a thirteenth arrangement pattern of a plurality of amplifier circuits according to the first embodiment. In FIG. 22, a first amplifier circuit 11, which is required to perform with the highest accuracy, is placed in a position farthest from a clock generator circuit 2 and a digital circuit 3 and closest to a power supply input terminal 1. A second amplifier circuit 15 is placed in a position farthest from the clock generator circuit 2 and closest to the power supply input terminal 1 and the digital circuit 3. A third amplifier circuit 19 is placed in a position farthest from the digital circuit 3 and the power supply input terminal 1 and closest to the clock generator circuit 2. And a fourth amplifier circuit 21, which can operate with the lowest accuracy, is placed in a position closest to the clock generator circuit 2 and the digital circuit 3 and farthest from the power supply input terminal 1. The thirteenth arrangement pattern like this assures the highest accuracy for the first amplifier circuit 11, thus improving the accuracy and speed of the AD converter as a whole. As seen in the twelfth and the thirteenth arrangement pattern, the arrangement pattern of a first amplifier circuit 11, a second amplifier circuit 15, a third amplifier circuit 19 and a fourth amplifier circuit 21 can be set flexibly relative to a power supply input terminal 1, a clock generator circuit 2 and a digital circuit 3, depending on the accuracy required by the respective amplifier circuits.

Second Embodiment

A second embodiment of the present invention relates to a cyclic-type AD converter capable of outputting a total of 10 bits by converting 4 bits initially and then performing three cycles of 2-bit conversion.

Figure 23:
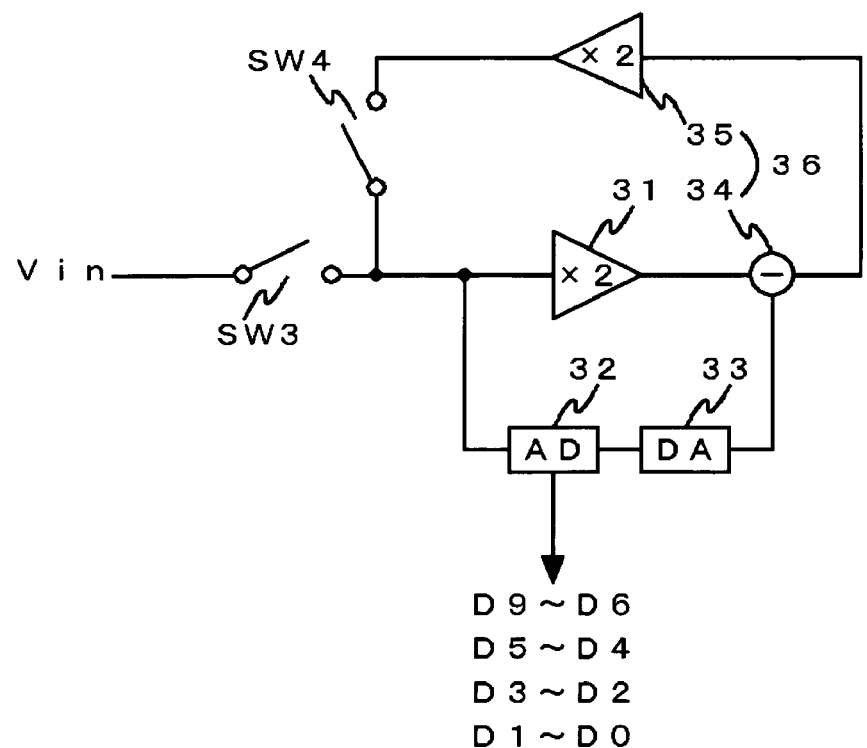
FIG. 23 illustrates a structure of an AD converter according to a second embodiment of the present invention.

FIG. 23 illustrates a structure of an AD converter according to the second embodiment. A first switch SW3 and a second switch SW4 are switches that turn on and off alternately with each other. In an initial state, the first switch SW3 is on and the second switch SW4 is off. An input analog signal Vin is inputted to a first amplifier circuit 31 and an AD converter circuit 32 via the first switch SW3. The AD converter circuit 32 is a flash type whose resolution, or the number of bits to be converted, is 4 bits. The AD converter circuits 32 converts the analog signal inputted via the first switch SW3 into a digital value, retrieves 4 higher-order bits (D9 to D6) and outputs them to an encoder (not shown) and a DA converter circuit 33. The DA converter circuit 33 converts the digital value outputted from the AD converter circuit 32 into an analog value. The first amplifier circuit 31 amplifies the inputted analog signal by a factor of 2 and outputs it to a subtracter circuit 34. The subtracter circuit 34 subtracts the output of the DA converter circuit 33 from the output of the first amplifier circuit 31. Here, the output of the DA converter circuit 33 at this point is practically a result of amplification by a factor of 2. This can be realized by setting the ratio of the reference voltage range of the AD converter circuit 32 to that of the DA converter circuit 33 at 1:2. A second amplifier circuit 35 amplifies the output of the subtracter circuit 34 by a factor of 2. It is to be noted here that the subtracter circuit 34 and the second amplifier circuit 35 may be formed as an integrally structured subtracter-amplifier circuit 36. This way, the circuit can be simplified.

At this stage, the first switch SW3 is already off and the second switch SW4 is on. An output analog signal from the second amplifier circuit 35 is fed back to the first amplifier circuit 31 and the AD converter circuit 32 via the second switch SW4. The AD converter circuit 32 performs a conversion of 2 bits excluding 1 redundant bit on the analog signal inputted via the second switch SW4, retrieves the 5th and 6th higher-order bits (D5 and D4) and outputs them to an encoder (not shown) and the DA converter circuit 33. The operation of the DA converter circuit 33, the first amplifier circuit 31, the subtracter circuit 34 and the second amplifier circuit 35 is the same as that for the first cycle. Since the AD converter circuit 32 performs a 2-bit conversion from the second cycle onward, the first amplifier circuit 31 and the second amplifier circuit 35 perform a total amplification practically by a factor of 4 (2 squared). From here on, the above-described processing will be repeated, and the AD converter circuit 32 retrieves the 7th and 8th higher-order bits (D3 and D2) and the 9th and 10th higher-order bits (D1 and D0). In this fashion, a digital value composed of ten bits is obtained.

The detailed structure of the first amplifier circuit 31 and the second amplifier circuit 35 is the same as that described in the first embodiment. Next, the arrangement patterns for the first amplifier circuit 31 and the second amplifier circuit 35 will be described. In an AD converter shown in FIG. 23, the degree of precision required by the first amplifier circuit 31 and the second amplifier circuit 35 generally matches with the sequence in which an analog signal is transmitted. That is, the level of precision required by the two amplifier circuits is in the descending order of the first amplifier circuit 31 and the second amplifier circuit 35. This is because the first amplifier circuit 31 covers a wider range than the second amplifier circuit 35 and accordingly the first amplifier circuit 31 requires the higher level of precision.

Figure 24:
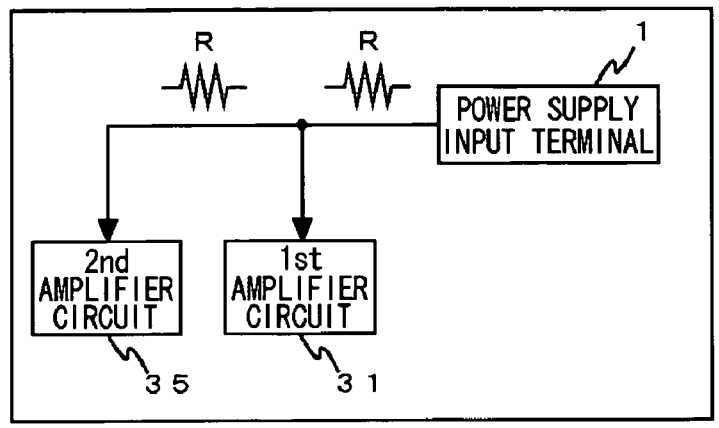
FIG. 24 conceptually illustrates a first arrangement pattern of amplifier circuits according to a second embodiment.

FIG. 24 conceptually illustrates a first arrangement pattern of two amplifier circuits according to the second embodiment. Referring to FIG. 24, when an AD converter is structured as an integrated circuit, the two amplifier circuits are arranged in the order of a first amplifier circuit 31 and a second amplifier circuit 35 from the side of a power supply input terminal 1. The first amplifier circuit 31, which needs to perform with the higher accuracy than the second amplifier circuit 35, is placed closer to the power supply input terminal 1 than the second amplifier circuit 35. Thus, the first amplifier circuit 31 is subject to the smaller resistance component R in power supply wiring than the second amplifier circuit 35. That is, the first amplifier circuit 31 is supplied with a power supply voltage with the smaller voltage drop than the second amplifier circuit 35, which contributes to an improvement in the accuracy and speed of the AD converter as a whole.

Figure 25:
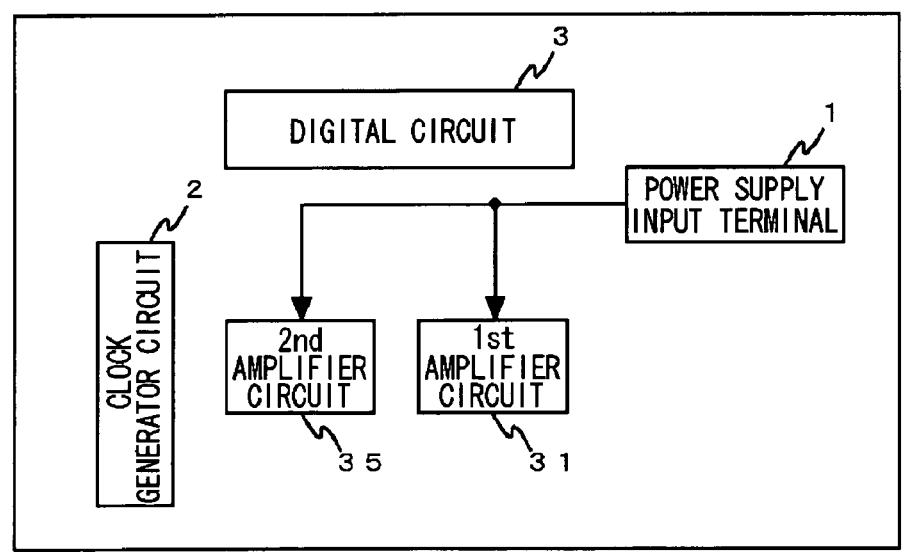
FIG. 25 conceptually illustrates a second arrangement pattern of amplifier circuits according to a second embodiment.

FIG. 25 conceptually illustrates a second arrangement pattern of two amplifier circuits according to the second embodiment. A clock generation circuit 2 and a digital circuit 3 can be noise sources. A larger noise component is injected to the substrate in the clock generation circuit 2 than in the digital circuit 3. In FIG. 25, a first amplifier circuit 31, which needs to perform with the higher accuracy than a second amplifier circuit 35, is placed closer to the power supply input terminal 1 than the second amplifier circuit 35. The second amplifier circuit 35 is placed closer to the clock generation circuit 2, and is placed farther from the power supply input terminal 1. The noise component transmitted through the substrate gets smaller as it goes farther from the noise source because the resistance component of the substrate and capacitance components, such as parasitic capacitance and line capacitance, produce the effect of a low-pass filter. And the power supply voltage drops more as it goes farther from the power input terminal1. Hence, the first amplifier circuit 31 thus configured is less subject to the effect of the noise component than the second amplifier circuit 35, so that the first amplifier circuit 31 has the higher precision of power supply voltage than the second amplifier circuit 35. Compared with a pattern where both the first amplifier circuit 31 and the second amplifier circuit 35 are placed approximately equidistant from the power supply input terminal 1 and the clock generation circuit 2, the configuration achieved by the second arrangement pattern can improve the accuracy and speed of the AD converter as a whole.

Though, in FIG. 25, both the first amplifier circuit 31 and the second amplifier circuit 35 are placed approximately equidistant from the digital circuit 3, the first amplifier circuit 31 may be placed farther away from the digital circuit 3 than the second amplifier circuit 35. If so, the precision of the first amplifier circuit 31 can be further improved.

Figure 26:
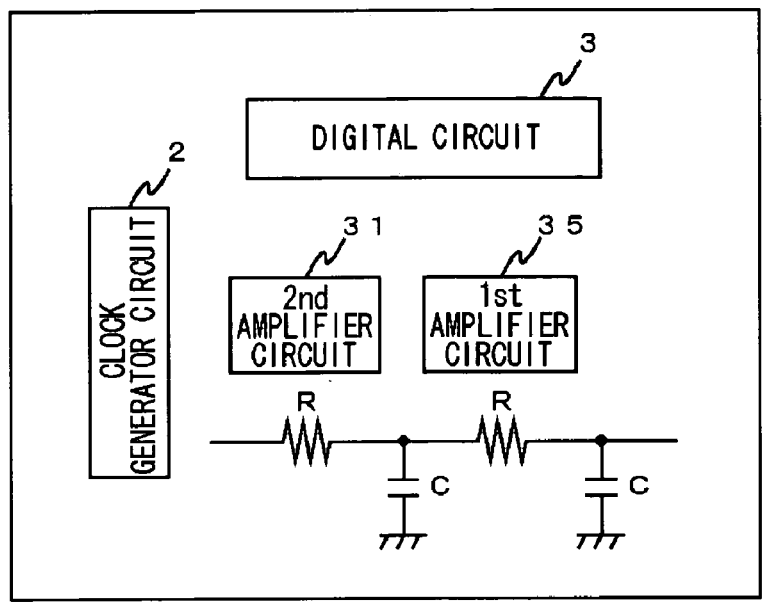
FIG. 26 conceptually illustrates a third arrangement pattern of amplifier circuits according to a second embodiment.

FIG. 26 conceptually illustrates a third arrangement pattern of two amplifier circuits according to the second embodiment. Referring to FIG. 26, the two amplifier circuits are arranged in the order of a second amplifier circuit 35 and a first amplifier circuit 31 from the side of a clock generation circuit 2. The first amplifier circuit 31, which needs to perform with the higher accuracy than the second amplifier circuit 35, is placed farther away from the clock generation circuit 2 than the second amplifier circuit 35. Thus, the first amplifier circuit 31 is less subject to the effect of the noise component transmitted through the substrate, so that the precision and speed of the AD converter as a whole can be improved.

Figure 27:
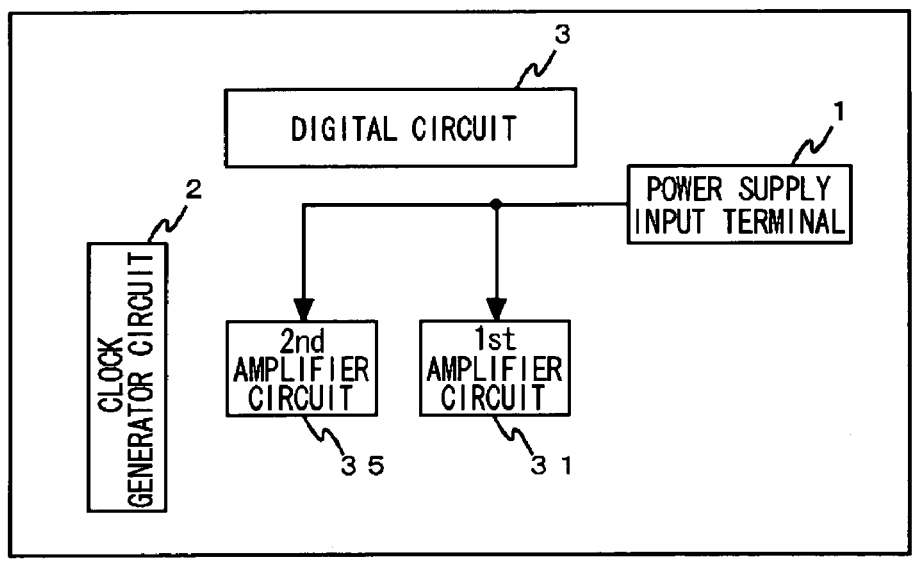
FIG. 27 conceptually illustrates a fourth arrangement pattern of amplifier circuits according to a second embodiment.

FIG. 27 conceptually illustrates a fourth arrangement pattern of two amplifier circuits according to the second embodiment. In FIG. 27, a first amplifier circuit 31, which needs to perform with the higher accuracy than a second amplifier circuit 35, is placed closer to a power supply input terminal 1 than the second amplifier circuit 35 and is placed farther away from a clock generation circuit 2. The second amplifier circuit 35 is placed closer to the clock generation circuit 2 and is placed farther away from the power supply input terminal 1. The noise component transmitted through the substrate gets smaller as it goes farther from the noise source because the resistance component of the substrate and capacitance components, such as parasitic capacitance and line capacitance, produce the effect of a low-pass filter. And the power supply voltage drops more as it goes farther from the power input terminal 1. Hence, the first amplifier circuit 31 thus configured is less subject to the effect of the noise component than the second amplifier circuit 35, so that the first amplifier circuit 31 has the higher precision of power supply voltage than the second amplifier circuit 35. Compared with a pattern where both the first amplifier circuit 31 and the second amplifier circuit 35 are placed approximately equidistant from the power supply input terminal 1 and the clock generation circuit 2, the configuration achieved by the third arrangement pattern can improve the accuracy and speed of the AD converter as a whole.

Though, in FIG. 27, both the first amplifier circuit 31 and the second amplifier circuit 35 are placed approximately equidistant from the digital circuit 3, the first amplifier circuit 31 may be placed farther away from the digital circuit 3 than the second amplifier circuit 35. If so, the precision of the first amplifier circuit 31 can be further improved.

The present invention has been described based on the embodiments which are only exemplary. It is therefore understood by those skilled in the art that there exist other various modifications to the combination of each component and process described above and that such modifications are also encompassed by the scope of the present invention.

The bit number to be converted and the allocation thereof and parameters of gain in the amplifier circuits and so forth described in each of the above embodiments are only exemplary, and other values may be used for these parameters in modified examples. The number of stages is not limited to one or two stages, and the present invention can be applied to a case when the number of stages is three or more. And a structure may be such that one or more stages are of a cyclic type.

In the first embodiment, the first amplifier circuit 11 may be removed. If either the sampling time of the input analog signal Vin of the second amplifier circuit 15 or the first subtracter-amplifier circuit 16 is adjusted or the input timing of the input analog signal Vin to the voltage comparison element constituting the first AD converter circuit 12 and the reference voltage is switched, then the operation of an AD converter as a whole can still be guaranteed even without the provision of the first amplifier circuit 11. In this modified example, the circuit area can be reduced. In this case, the level of precision required generally is in the order of the second amplifier circuit 15, the third amplifier circuit 19 and the fourth amplifier circuit 21. In the similar manner, the third amplifier circuit 19 may be eliminated. In this case, the level of precision required generally is in the order of the first amplifier circuit 11, the second amplifier circuit 15 and the fourth amplifier circuit 21.

In each of the above embodiments, described was an example where each amplifier circuit is constituted by a switched-capacitor operational amplifier to improve the sampling timing of the input signals. However, such an embodied amplifier circuit is not limited thereto, and a general amplifier circuit using principally a resistor or resistors may also be used.

In each of the above embodiments, the amplifier circuits are described as being fabricated using a CMOS process. Alternatively, the amplifier circuits may also be fabricated using a transistor-transistor logic (TTL) process.

Although the present invention has been described by way of exemplary embodiments, it should be understood that many changes and substitutions may further be made by those skilled in the art without departing from the scope of the present invention which is defined by the appended claims.

What is claimed is:

1. An analog-to-digital converter, which converts an analog signal to a digital signal of a plurality of bits in such a manner that an input analog signal is circulated a plurality of times, the analog-to-digital converter characterized in that it has a plurality of amplifier circuits wherein an amplifier circuit that requires higher accuracy among the plurality of amplifier circuits is placed nearer to a power source.

2. An analog-to-digital converter according to claim 1, wherein an amplifier circuit to which the input analog signal is first inputted is placed nearer to the power source than the other amplifier circuits.

3. An analog-to-digital converter according to claim 1, wherein the plurality of amplifier circuits are placed nearer to the power source in accordance with the order in which the input analog signal is transmitted.

4. An analog-to-digital converter according to claim 1, wherein among the plurality of amplifier circuits an amplifier circuit that requires accuracy is placed in a position away from a circuit of a noise source.

5. An analog-to-digital converter according to claim 2, wherein among the plurality of amplifier circuits an amplifier circuit that requires accuracy is placed in a position away from a circuit of a noise source.

6. An analog-to-digital converter according to claim 3, wherein among the plurality of amplifier circuits an amplifier circuit that requires accuracy is placed in a position away from a circuit of a noise source.

7. An analog-to-digital converter according to claim 1, wherein an amplifier circuit to which the input analog signal is first inputted is placed in a position farther away, from a circuit of a noise source, than the other amplifier circuits.

8. An analog-to-digital converter according to claim 2, wherein an amplifier circuit to which the input analog signal is first inputted is placed in a position farther away, from a circuit of a noise source, than the other amplifier circuits.

9. An analog-to-digital converter according to claim 3, wherein an amplifier circuit to which the input analog signal is first inputted is placed in a position farther away, from a circuit of a noise source, than the other amplifier circuits.

10. An analog-to-digital converter according to claim 1, wherein the plurality of amplifier circuits are respectively placed in positions farther away, from a circuit of a noise source, in accordance with the order in which the input analog signal is transmitted.

11. An analog-to-digital converter according to claim 2, wherein the plurality of amplifier circuits are respectively placed in positions farther away, from a circuit of a noise source, in accordance with the order in which the input analog signal is transmitted.

12. An analog-to-digital converter according to claim 3, wherein the plurality of amplifier circuits are respectively placed in positions farther away, from a circuit of a noise source, in accordance with the order in which the input analog signal is transmitted.

13. An analog-to-digital converter according to claim 4, wherein the circuit of a noise source is a clock generation circuit that generates clock signals or a digital circuit that performs digital signal processings.

14. An analog-to-digital converter according to claim 7, wherein the circuit of a noise source is a clock generation circuit that generates clock signals or a digital circuit that performs digital signal processings.

15. An analog-to-digital converter according to claim 10, wherein the circuit of a noise source is a clock generation circuit that generates clock signals or a digital circuit that performs digital signal processings.

16. An analog-to-digital converter according to claim 1, the converter including:
- a plurality of stages each of which converts an inputted analog signal to a digital value of a predetermined bit number,
- wherein one or more of the plurality of stages includes one amplifier circuit among the plurality of amplifier circuits, and
- wherein the one amplifier circuit amplifies a difference between the inputted analog signal and a signal after conversion of a digital value to be converted in own stage into an analog signal, and feeds the amplified difference back to an input of the own stage.

17. An analog-to-digital converter according to claim 4, the converter including:
- a plurality of stages each of which converts an inputted analog signal to a digital value of a predetermined bit number,
- wherein one or more of the plurality of stages includes one amplifier circuit among the plurality of amplifier circuits, and
- wherein the one amplifier circuit amplifies a difference between the inputted analog signal and a signal after conversion of a digital value to be converted in own stage into an analog signal, and feeds the amplified difference back to an input of the own stage.

18. An analog-to-digital converter according to claim 1, the converter including:
- a plurality of stages each of which converts an inputted analog signal to a digital value of a predetermined bit number,
- wherein one or more of the plurality of stages includes two amplifier circuits among the plurality of amplifier circuits;
- wherein a first amplifier circuit of the two amplifier circuits amplifies the inputted analog signal by a first predetermined gain, and
- wherein a second amplifier circuit of the two amplifier circuits amplifies, by a second predetermined gain, a difference between an analog signal outputted from the first amplifier circuit and a signal which is amplified by a gain practically identical to the first predetermined gain and is subjected to conversion of a digital value to be converted in own stage into an analog signal, and feeds the amplified difference back to an input of the own stage.

19. An analog-to-digital converter according to claim 4, the converter including:
- a plurality of stages each of which converts an inputted analog signal to a digital value of a predetermined bit number,
- wherein one or more of the plurality of stages includes two amplifier circuits among the plurality of amplifier circuits,
- wherein a first amplifier circuit of the two amplifier circuits amplifies the inputted analog signal by a first predetermined gain, and
- wherein a second amplifier circuit of the two amplifier circuits amplifies, by a second predetermined gain, a difference between an analog signal outputted from the first gain and a signal which is amplified by a gain practically identical to the first predetermined gain and is subjected to conversion of a digital value to be converted in own stage into an analog signal, and feeds the amplified difference back to an input of the own stage.

20. An analog-to-digital converter according to claim 1, the converter including:
- an AD converter circuit which converts an inputted analog signal to a digital value of a predetermined bit number; and
- a DA converter circuit which converts an output of said AD converter circuit to an analog signal,
- wherein a first amplifier circuit of the plurality of amplifier circuits amplifies the inputted analog signal by a first predetermined gain, and
- wherein a second amplifier circuit of the plurality of amplifier circuits amplifies, by a second predetermined gain, a difference between an analog signal outputted from the first amplifier circuit and an analog signal, outputted from said DA converter circuit, which is amplified by a gain practically identical to the first predetermined gain, and outputs the amplified difference to said AD converter circuit and said first amplifier circuit.

21. An analog-to-digital converter according to claim 4, the converter including:
- an AD converter circuit which converts an inputted analog signal to a digital value of a predetermined bit number; and
- a DA converter circuit which converts an output of said AD converter circuit to an analog signal,
- wherein a first amplifier circuit of the plurality of amplifier circuits amplifies the inputted analog signal by a first predetermined gain, and
- wherein a second amplifier circuit of the plurality of amplifier circuits amplifies, by a second predetermined gain, a difference between an analog signal outputted from the first amplifier circuit and an analog signal, outputted from said DA converter circuit, which is amplified by a gain practically identical to the first predetermined gain, and outputs the amplified difference to said AD converter circuit and said first amplifier circuit.

22. An analog-to-digital converter, which converts an analog signal to a digital signal of a plurality of bits in such a manner that an input analog signal is circulated a plurality of times, the analog-to-digital converter characterized in that it has a plurality of amplifier circuits wherein an amplifier circuit that requires higher accuracy among the plurality of amplifier circuits is placed in a position away from a circuit of a noise source.

23. An analog-to-digital converter according to claim 22, wherein an amplifier circuit to which the input analog signal is first inputted is placed in a position farther away, from the circuit of a noise source, than the other amplifier circuits.

24. An analog-to-digital converter according to claim 22, wherein the plurality of amplifier circuits are respectively placed in positions farther away, from the circuit of a noise source, in accordance with the order in which the input analog signal is transmitted.

25. An analog-to-digital converter according to claim 22, wherein the circuit of a noise source is a clock generation circuit that generates clock signals or a digital circuit that performs digital signal processings.

26. An analog-to-digital converter according to claim 23, wherein the circuit of a noise source is a clock generation circuit that generates clock signals or a digital circuit that performs digital signal processings.

27. An analog-to-digital converter according to claim 24, wherein the circuit of a noise source is a clock generation circuit that generates clock signals or a digital circuit that performs digital signal processings.

28. An analog-to-digital converter according to claim 22, the converter including:
- a plurality of stages each of which converts an inputted analog signal to a digital value of a predetermined bit number,
- wherein one or more of the plurality of stages includes one amplifier circuit among the plurality of amplifier circuits, and
- wherein the one amplifier circuit amplifies a difference between the inputted analog signal and a signal after conversion of a digital value to be converted in own stage into an analog signal, and feeds the amplified difference back to an input of the own stage.

29. An analog-to-digital converter according to claim 22, the converter including:
- a plurality of stages each of which converts an inputted analog signal to a digital value of a predetermined bit number,
- wherein one or more of the plurality of stages includes two amplifier circuits among the plurality of amplifier circuits,
- wherein a first amplifier circuit of the two amplifier circuits amplifies the inputted analog signal by a first predetermined gain, and
- wherein a second amplifier circuit of said two amplifier circuits amplifies, by a second predetermined gain, a difference between an analog signal outputted from the first amplifier circuit and a signal which is amplified by a gain practically identical to the first predetermined gain and is subjected to conversion of a digital value to be converted in own stage into an analog signal, and feeds the amplified difference backto an input of the own stage.

30. An analog-to-digital converter according to claim 22, the converter including:
- an AD converter circuit which converts an inputted analog signal to a digital value of a predetermined bit number; and
- a DA converter circuit which converts an output of said AD converter circuit to an analog signal,
- wherein a first amplifier circuit of the plurality of amplifier circuits amplifies the inputted analog signal by a first predetermined gain, and
- wherein a second amplifier circuit of the plurality of amplifier circuits amplifies, by a second predetermined gain, a difference between an analog signal outputted from the first amplifier circuit and an analog signal, outputted from said DA converter circuit, which is amplified by a gain practically identical to the first predetermined gain, and outputs the amplified difference to said AD converter circuit and said first amplifier circuit.

* * * * *